(12) United States Patent
Duncan et al.

(10) Patent No.: US 12,232,289 B2
(45) Date of Patent: Feb. 18, 2025

(54) TEMPEST SEAL FOR MODULAR DATA CENTERS

(71) Applicant: Dell Products L.P., Round Rock, TX (US)

(72) Inventors: Tyler Baxter Duncan, Austin, TX (US); Anthony Middleton, Cedar Park, TX (US); Jeffery Todd Sayles, San Marcos, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 252 days.

(21) Appl. No.: 17/970,357

(22) Filed: Oct. 20, 2022

(65) Prior Publication Data

US 2024/0138089 A1    Apr. 25, 2024
US 2024/0237256 A9    Jul. 11, 2024

(51) Int. Cl.
*H05K 7/14*    (2006.01)
*H05K 9/00*    (2006.01)

(52) U.S. Cl.
CPC ......... *H05K 7/1488* (2013.01); *H05K 9/0015* (2013.01)

(58) Field of Classification Search
CPC .......... G02B 2207/121; H05K 9/0015; H05K 7/1488; H05K 7/1497
See application file for complete search history.

*Primary Examiner* — James Wu
*Assistant Examiner* — Dakota M Talbert
(74) *Attorney, Agent, or Firm* — Aly Z. Dossa; Chamberlain, Hrdlicka, White, Williams & Aughtry

(57) ABSTRACT

A modular data center includes: a modular information technology component (MITC), in which the MITC includes a first scaffold; and a modular environmental control component (MECC), in which the MECC includes a second scaffold, in which the first scaffold is connected to the second scaffold to form a scaffold interface, in which an enclosure component is affixed to an outside surface of the first scaffold and to an outside surface of the second scaffold, and in which, once affixed to the first scaffold and to the second scaffold, the enclosure component overlaps at least a portion of the scaffold interface.

2 Claims, 11 Drawing Sheets

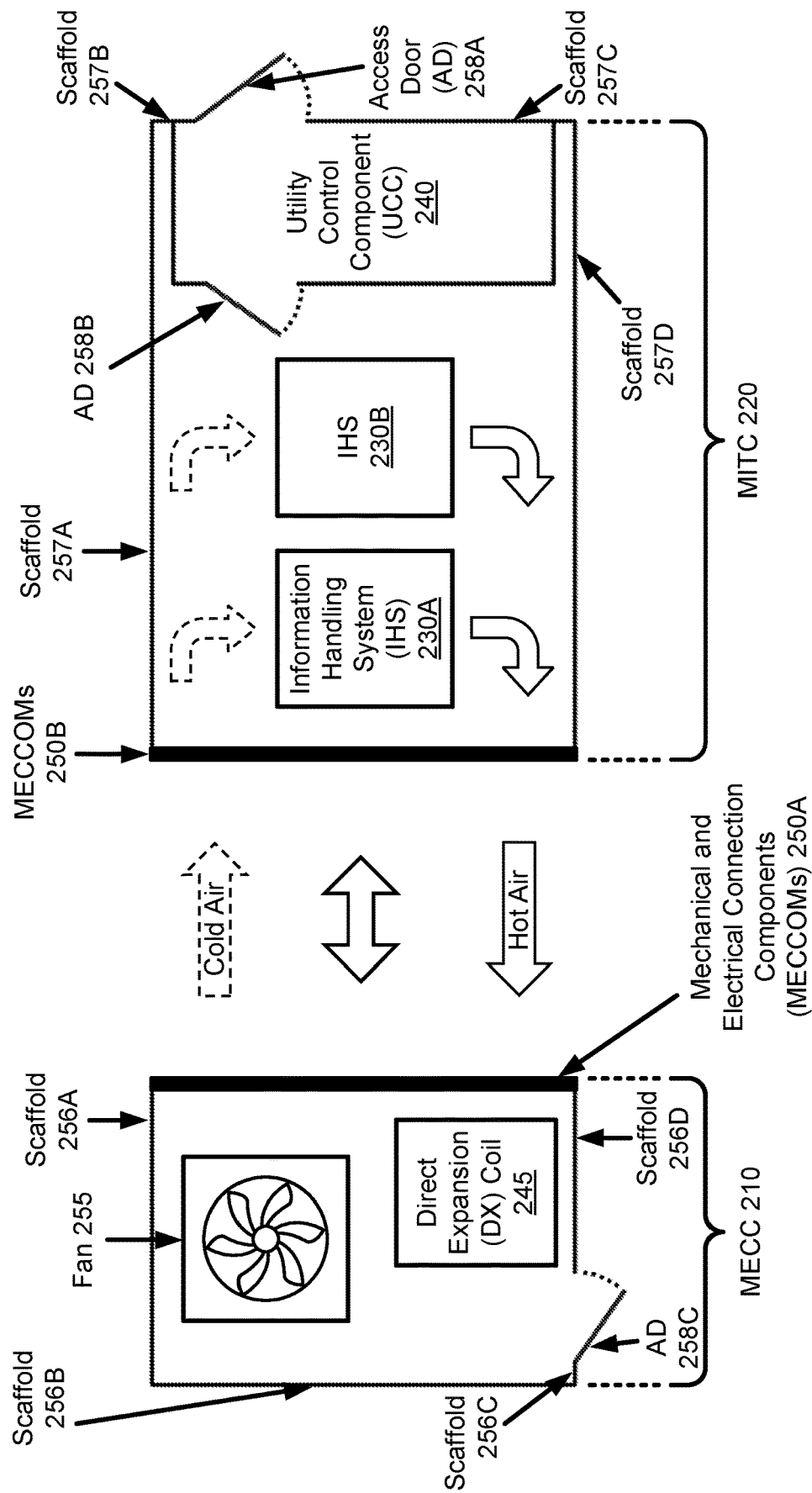
FIG. 2.1

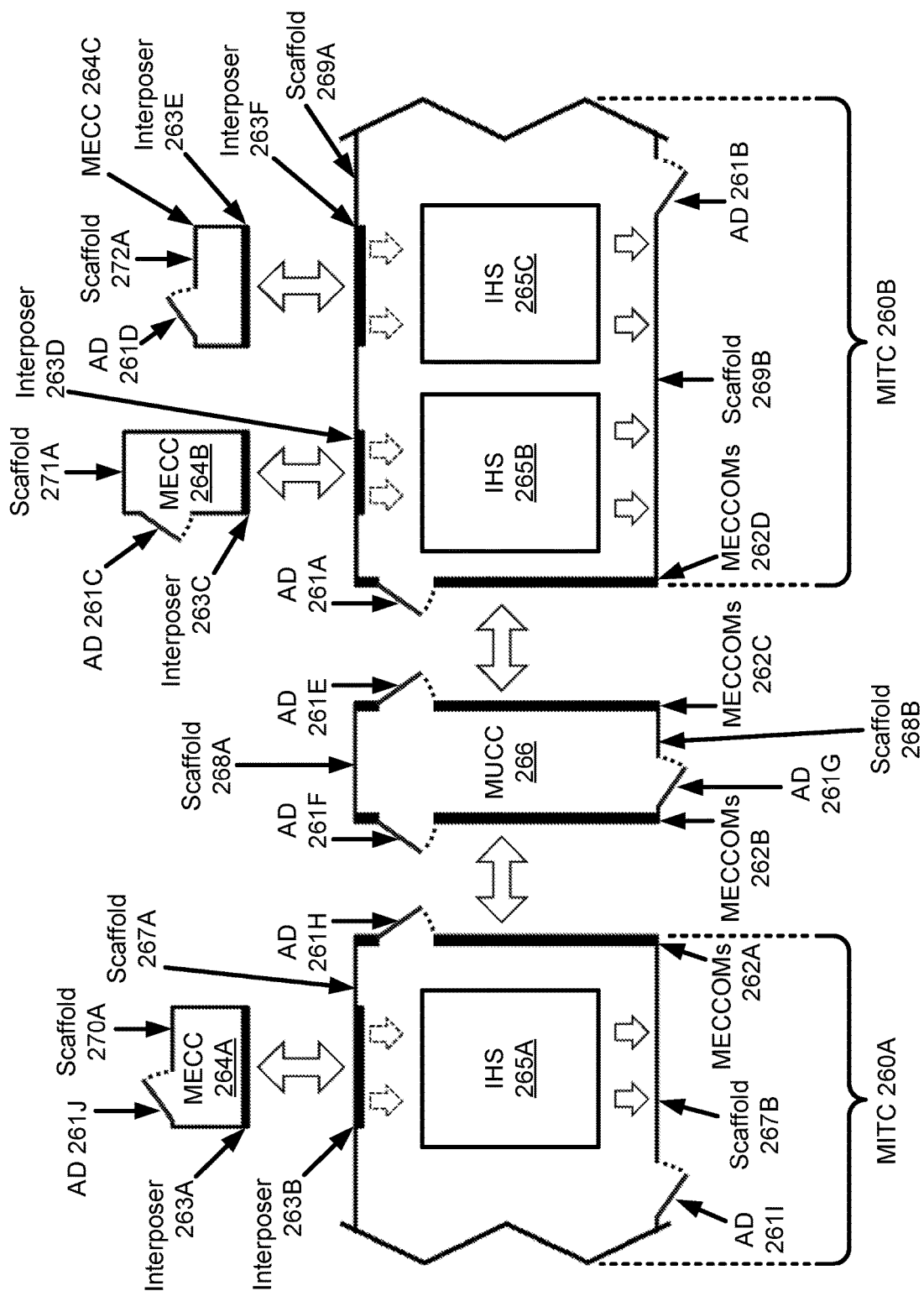
FIG. 2.2

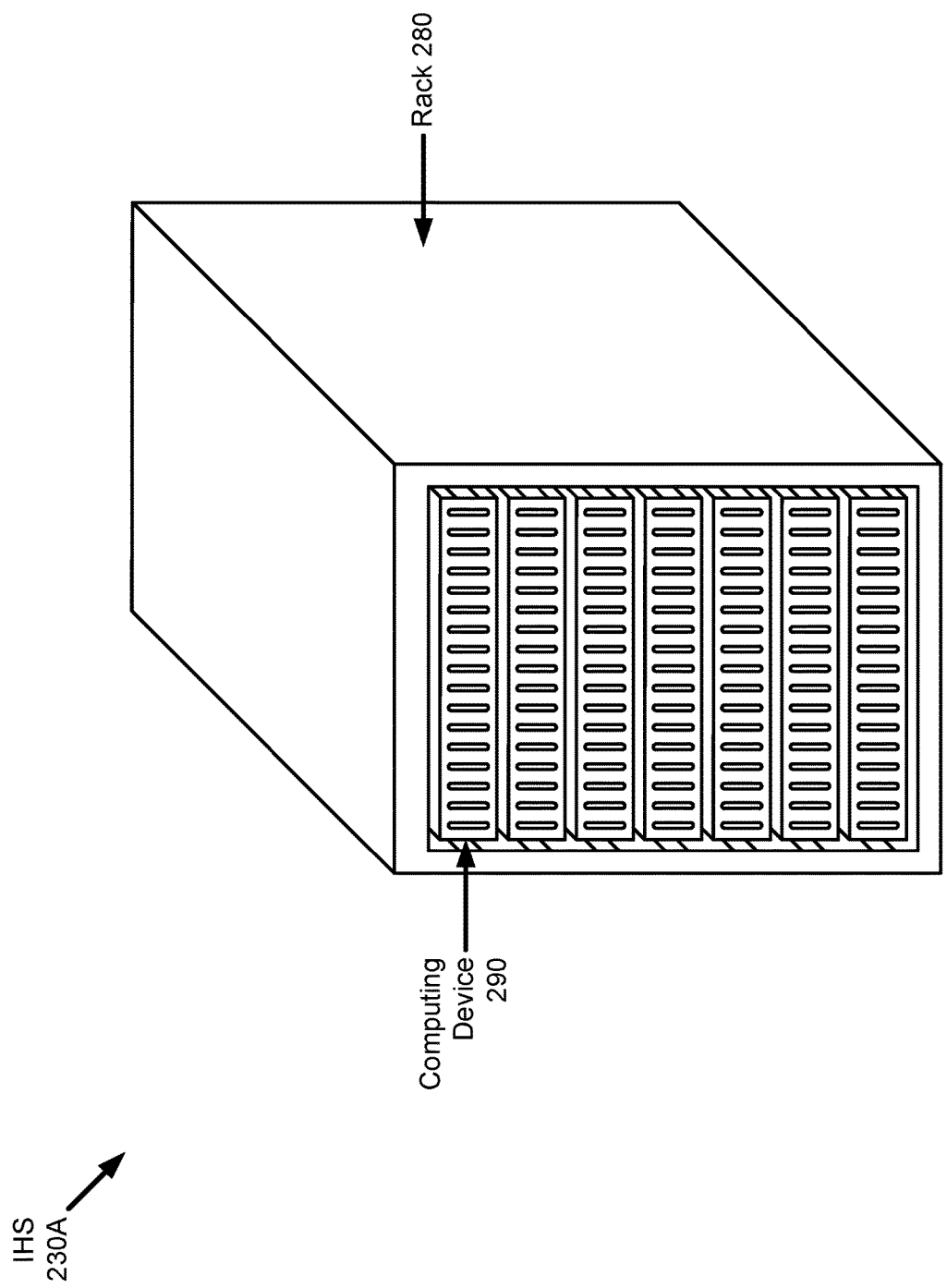
FIG. 2.3

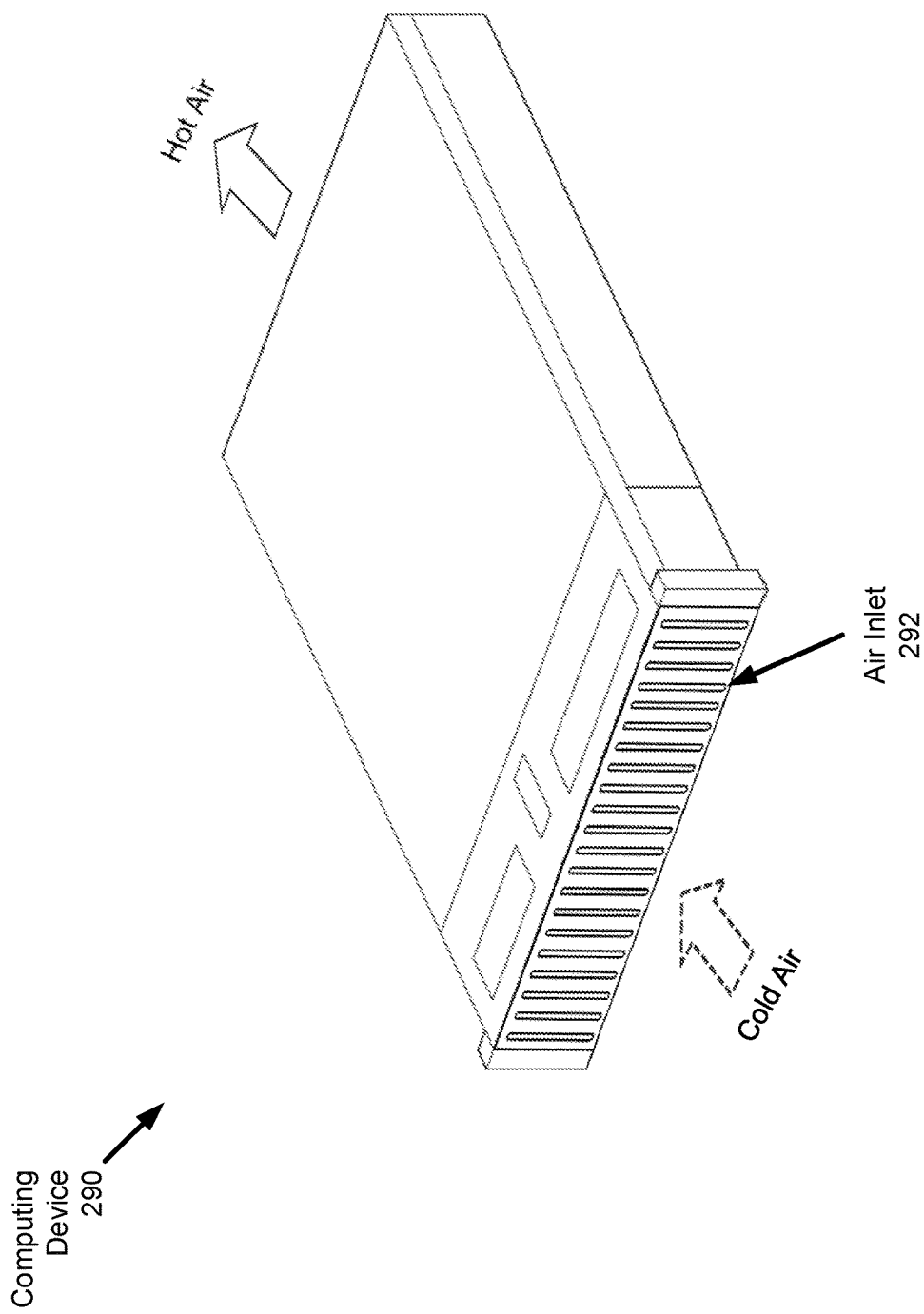
FIG. 2.4

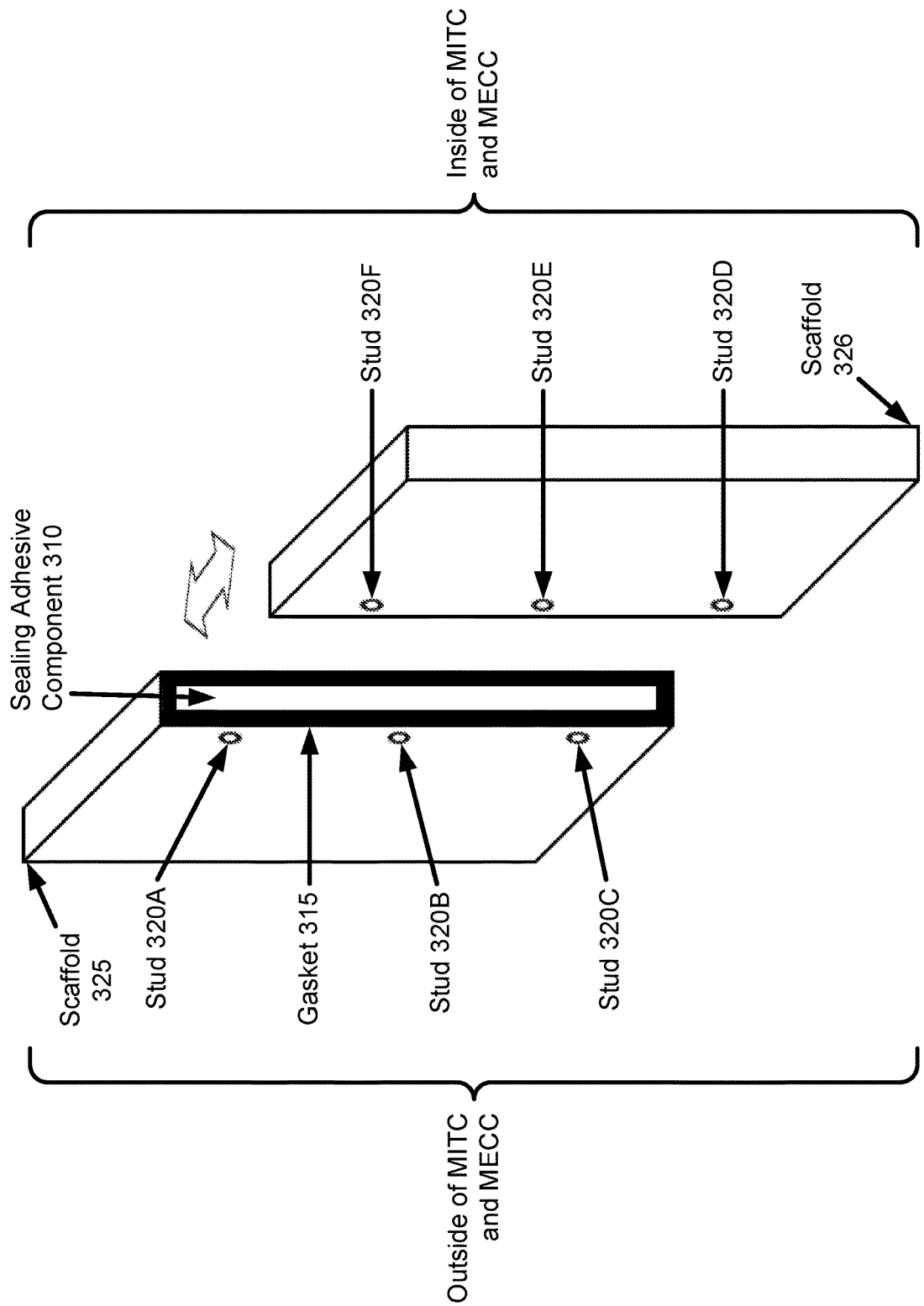
FIG. 3.1

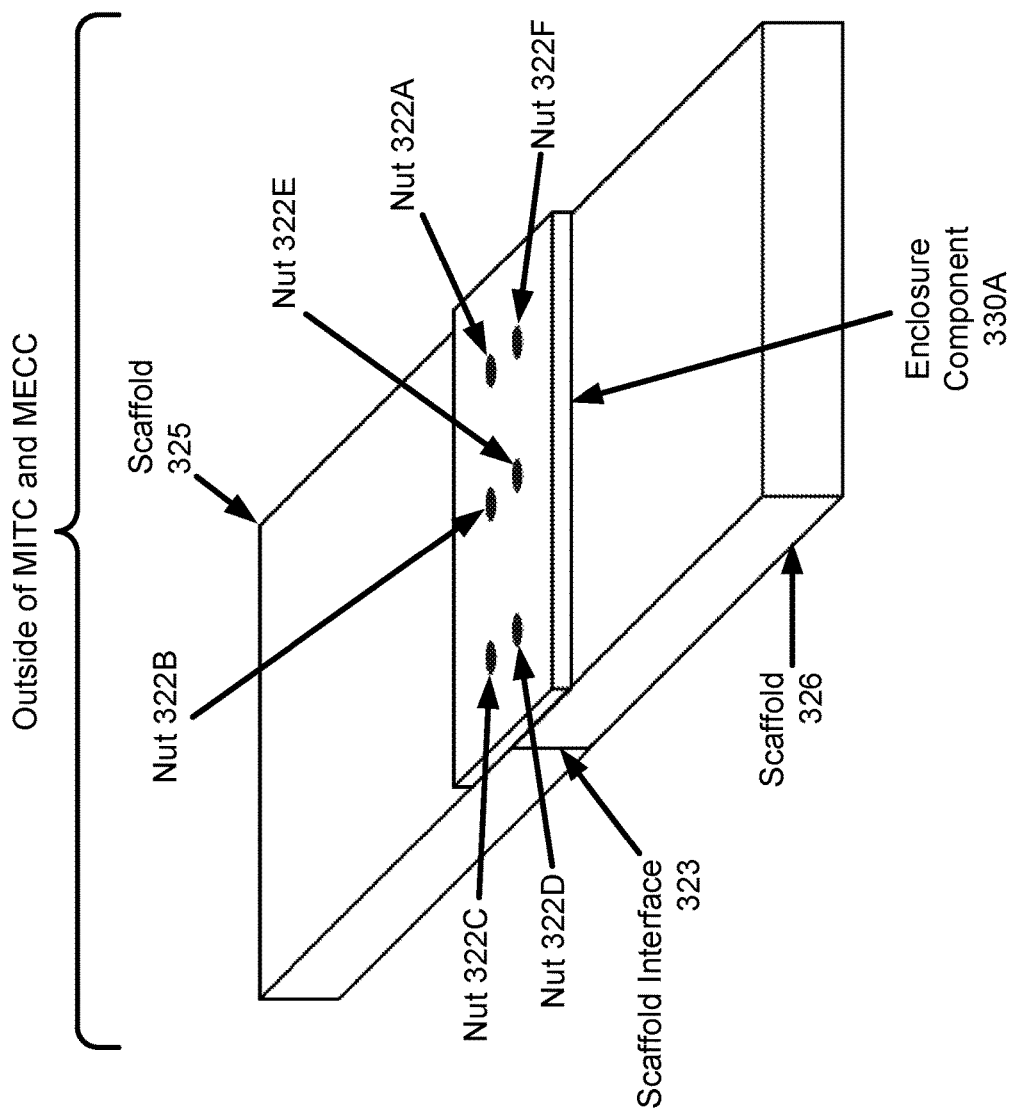
FIG. 3.2

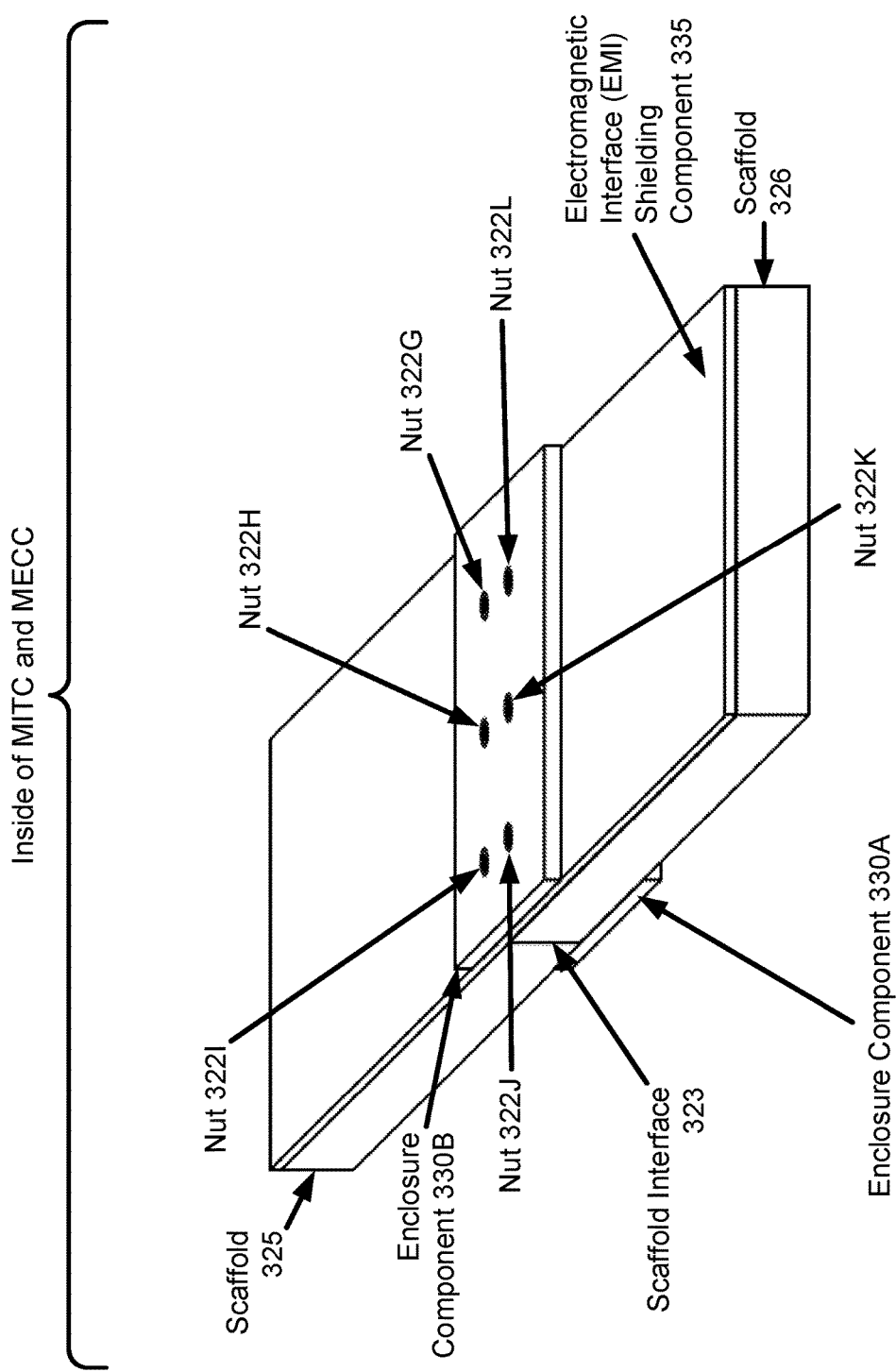
FIG. 3.3

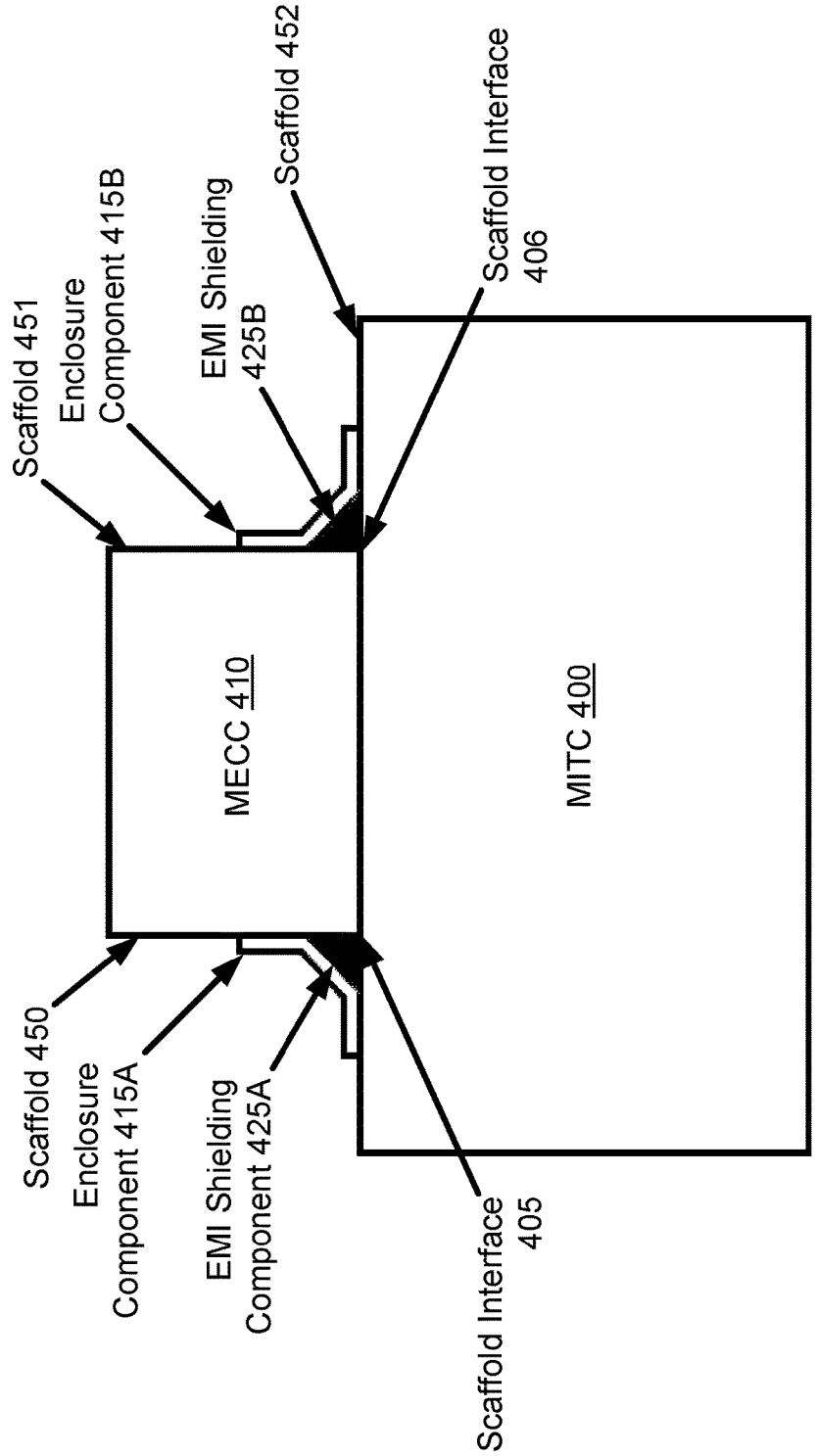
FIG. 4.1

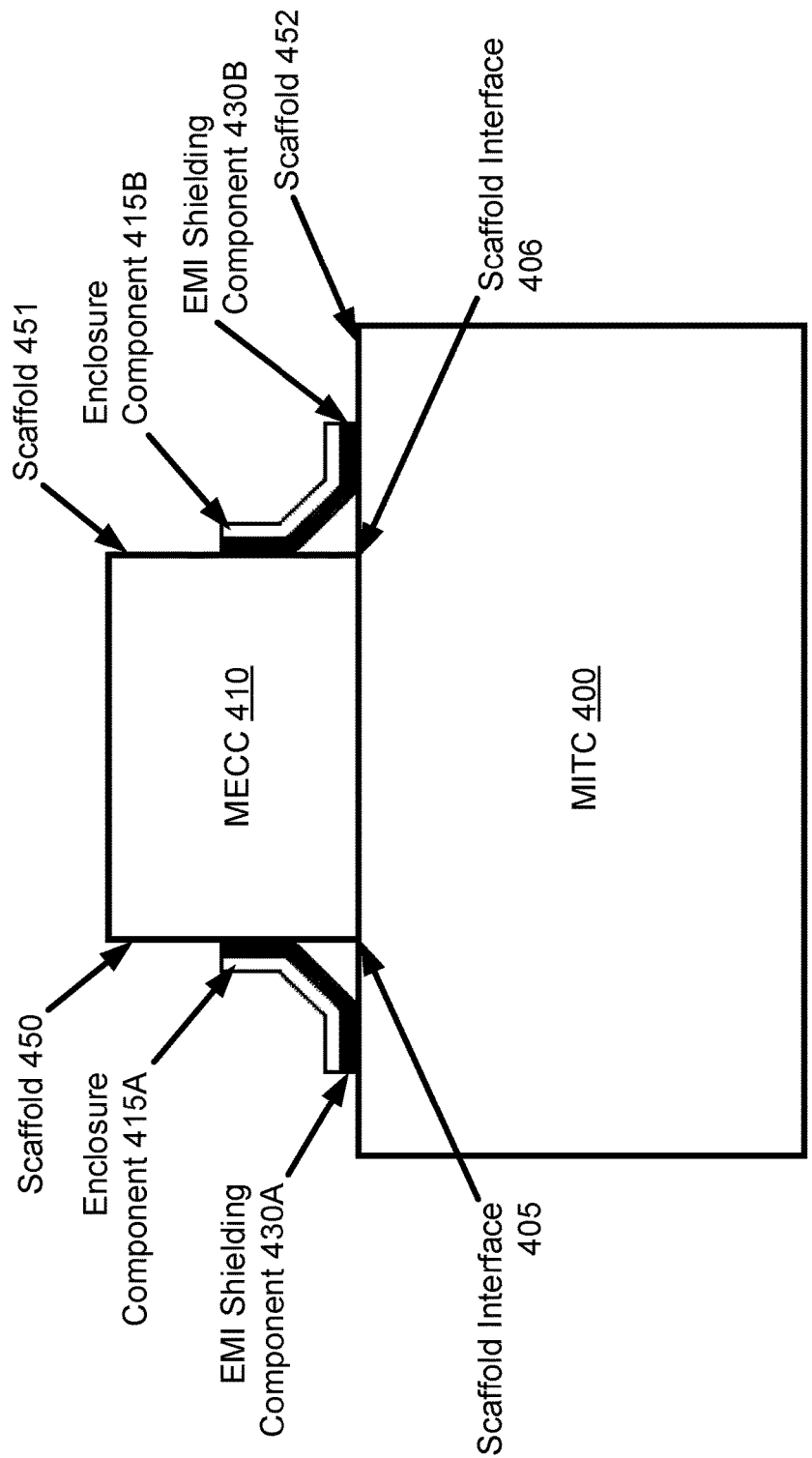
FIG. 4.2

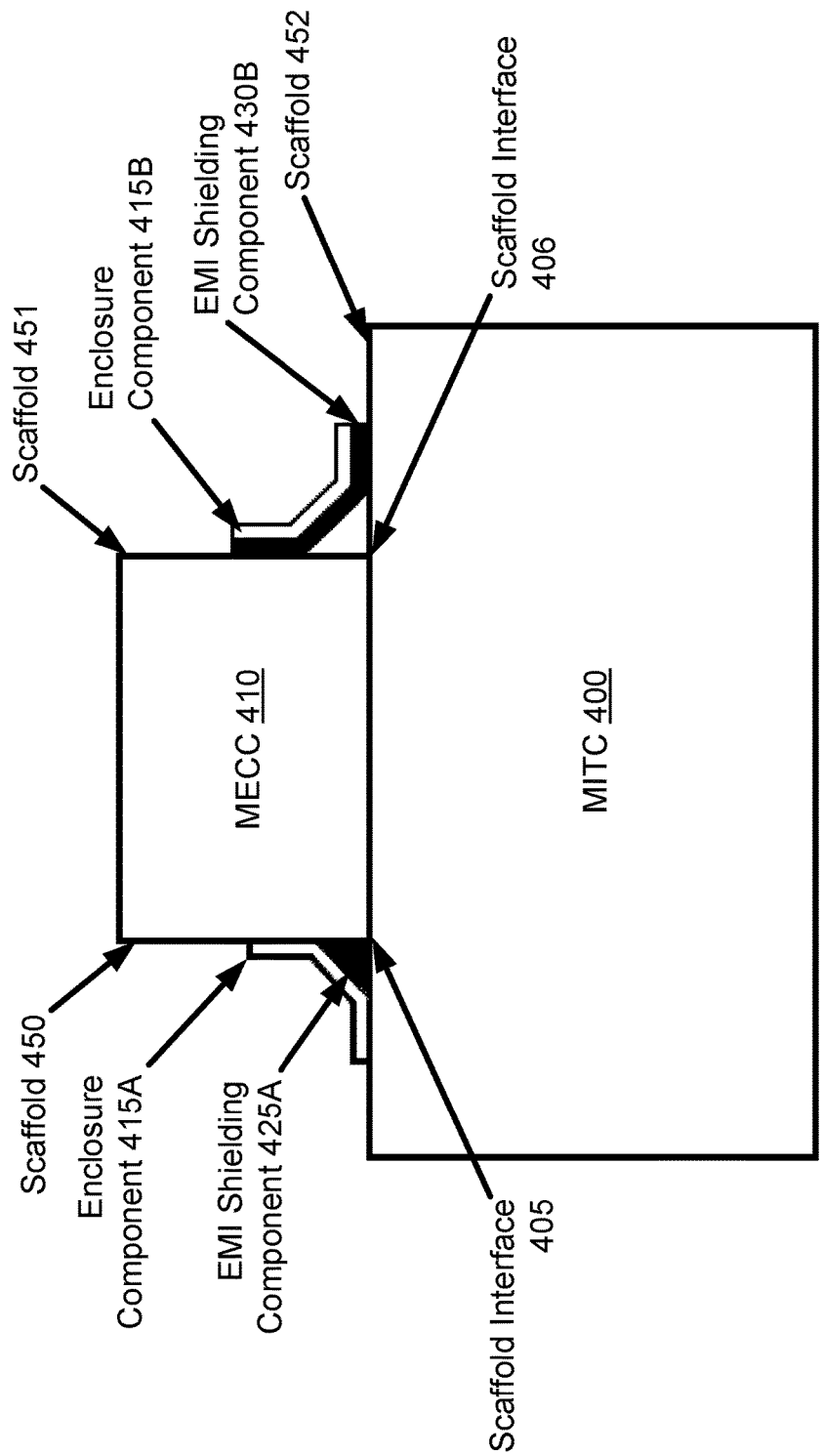
FIG. 4.3

TEMPEST SEAL FOR MODULAR DATA CENTERS

BACKGROUND

The heterogeneous data center environments witnessed today often require a combination of various cooling, power, and information technology (IT) components. The cooling, power, and IT components are available either commercially with minimum configuration options (e.g., one-size-fits-all) or through a full custom solution for a specific customer demand. This either impacts scalability of the heterogeneous data center environments, or requires resource-intensive engineering for deployment of the cooling, power, and IT components.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

FIG. 2.1 shows a top view of the system of FIG. 1 in accordance with one or more embodiments of the invention.

FIG. 2.2 shows a top view of a system in accordance with one or more embodiments of the invention.

FIG. 2.3 shows a diagram of an information handling system (IHS) in accordance with one or more embodiments of the invention.

FIG. 2.4 shows a diagram of a computing device in accordance with one or more embodiments of the invention.

FIGS. 3.1-3.3 show a pairing process of a portion of a connection interface of a modular information technology component (MITC) and a portion of a connection interface of a modular environmental control component (MECC) to implement a TEMPEST seal in accordance with one or more embodiments of the invention.

FIGS. 4.1-4.3 show top views of a portion of the system of FIG. 2.2 in accordance with one or more embodiments of the invention.

DETAILED DESCRIPTION

Figure 1:
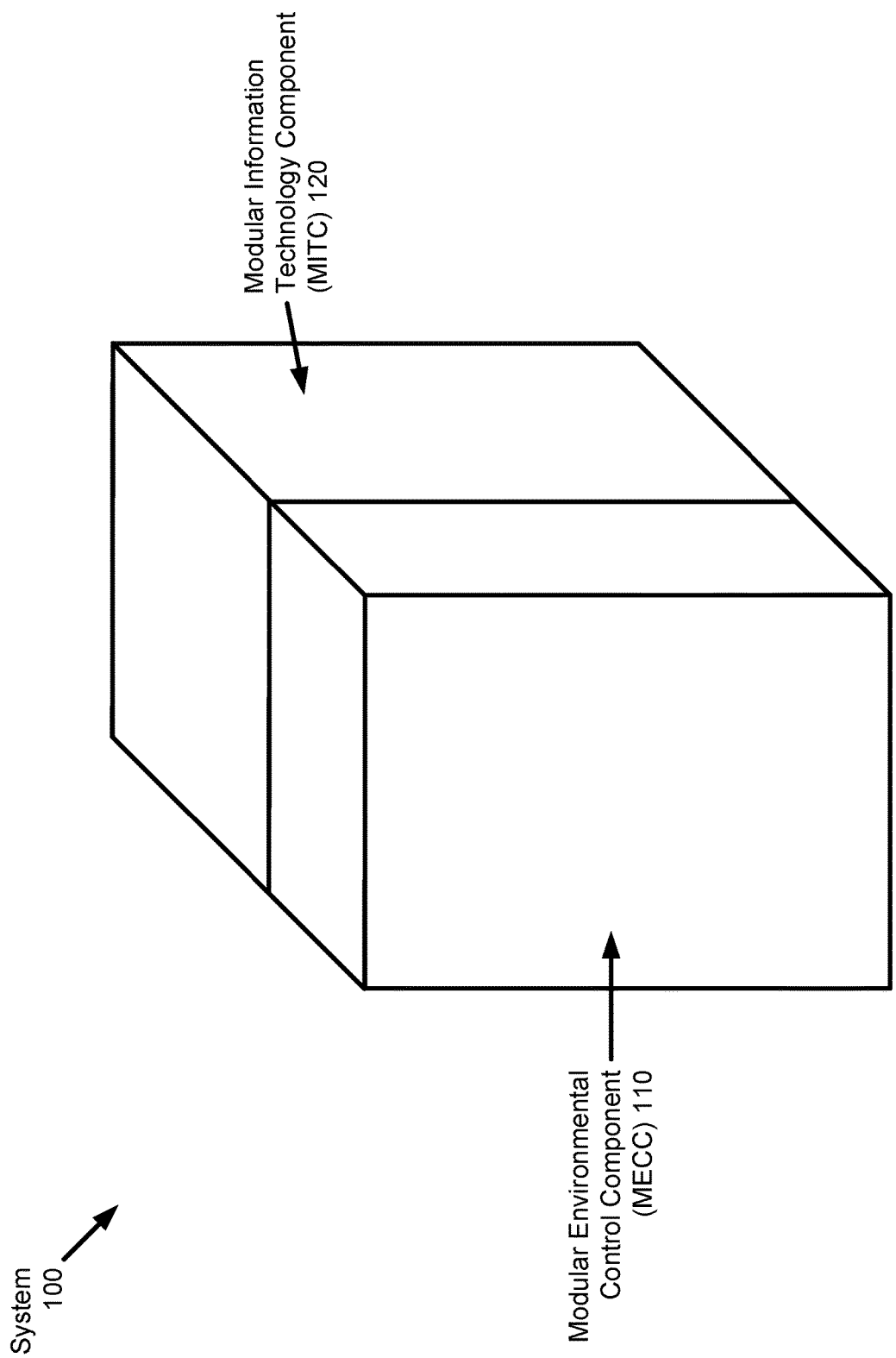
FIG. 1 shows a diagram of a system in accordance with one or more embodiments of the invention.

Specific embodiments of the invention will now be described in detail with reference to the accompanying figures. In the following detailed description of the embodiments of the invention, numerous specific details are set forth in order to provide a more thorough understanding of one or more embodiments of the invention. However, it will be apparent to one of ordinary skill in the art that one or more embodiments of the invention may be practiced without these specific details. In other instances, well-known features have not been described in detail to avoid unnecessarily complicating the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout this application, elements of figures may be labeled as A to N. As used herein, the aforementioned labeling means that the element may include any number of items, and does not require that the element include the same number of elements as any other item labeled as A to N. For example, a data structure may include a first element labeled as A and a second element labeled as N. This labeling convention means that the data structure may include any number of the elements. A second data structure, also labeled as A to N, may also include any number of elements. The number of elements of the first data structure, and the number of elements of the second data structure, may be the same or different.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct connection (e.g., wired directly between two devices or components) or indirect connection (e.g., wired and/or wireless connections between any number of devices or components connecting the operatively connected devices). Thus, any path through which information may travel may be considered an operative connection.

In general, in order to process and/or to store sensitive (e.g., classified) information (e.g., data), a customer may need to use a modular data center (MDC) that satisfies intelligence community directive (ICD)-705 requirements (e.g., transient electromagnetic pulse emanation standard (TEMPEST) requirements). Typically, an ability to comply with the TEMPEST requirements and with customer-specific requirements (e.g., shipping to a customer site over a road, installation at the customer site, etc.) in the MDC requires resource (e.g., engineering, manufacturing, procurement, etc.) intensive efforts. Embodiments of the invention are not limited to satisfying TEMPEST (or equivalent) requirements.

To address one or more of the aforementioned issues, embodiments of the invention provide a pairing methodology (e.g., a pairing process) on how to pair components of the MDC while satisfying the TEMPEST requirements and the customer-specific requirements at the same time. More specifically, embodiments of the invention describe how to install TEMPEST compatible connections (e.g., mechanical connections) between the paired components of the MDC. This advantageously minimizes the resource-intensive efforts to satisfy the TEMPEST requirements and the customer-specific requirements in the MDC.

The following describes various embodiments of the invention.

As used herein, an "MDC" includes any facility or a portion of a facility in which computing operations are carried out. An MDC may include IHSs and IHS components coupled together as functional IHSs, in which the IHSs and the functional IHSs are dedicated to serve specific functions or to serve multiple functions. Examples of computing operations may include (but not limited to): information processing, communications, testing, simulations, power distribution and control, operational control, etc.

Turning now to FIG. 1, FIG. 1 shows a diagram of a system (100) in accordance with one or more embodiments of the invention. The system (100) includes an MITC (120) and a MECC (110). The system (100) may include additional, fewer, and/or different components (e.g., modular building blocks) without departing from the scope of the invention. Each component illustrated in FIG. 1 is described below in reference to FIG. 2.1.

Turning now to FIG. 2.1, FIG. 2.1 shows a top view of the system of FIG. 1 in accordance with one or more embodiments of the invention. In an embodiment of the invention shown in FIG. 2.1, the MITC (220) may be a mechanical structure that enables one or more IHSs (230A, 230B) and a utility control component (UCC) (240) to be disposed within the MITC (220).

In one or more embodiments, while disposing, the IHSs (230A, 230B) may be affixed to a floor (not shown) within the MITC (220) via standard mechanical mechanisms (e.g., bolts, screws, nuts, studs, etc.). In one or more embodiments, the floor is affixed to a bottom side of the MITC (220). Other mechanical or non-mechanical (e.g., glue, an adhesive tape, etc.) mechanisms for affixing the IHSs (230A, 230B) to the floor may be used without departing from the scope of the invention.

In one or more embodiments, a white space within the MITC (220), where the IHSs (230A, 230B) are located, may have a functionality to host different types of standard racks (e.g., 4×750 millimeter (mm) wide racks, 5×600 mm wide racks, 5×48 rack unit (RU) racks, etc.). As a unit of measurement, the RU is equal to 1.75 inches and the RU defines an increment within a standard rack. The white space may also have a functionality to host custom designed racks. Both standard (e.g., off-the-shelf) racks and custom designed racks may be pre-integrated into the floor before transportation to the customer site (e.g., a customer location, a customer facility, etc.).

In one or more embodiments, apart from hosting the IHSs (230A, 230B), the white space may also host other components, for example (but not limited to): immersion tanks, uninterruptible power supplies (UPSs), battery racks, cable management towers, cooling distribution units (CDUs), etc.

The aforementioned example is not intended to limit the scope of the invention.

In one or more embodiments, the MITC (220) may be implemented as other types of structures adapted to host, position, orient, and/or otherwise physically, mechanically, electrically, and/or thermally manage the IHSs (230A, 230B) and the UCC (240). In this manner, the MITC (220) may enable the IHSs (230A, 230B) and the UCC (240) to be densely packed without negatively impacting the operation of the IHSs (230A, 230B) and the UCC (240).

In one or more embodiments, an IHS (e.g., 230A) may include a rack and any number of computing devices. Additional details of the IHS are described below in reference to FIGS. 2.3 and 2.4.

In one or more embodiments, the UCC (240) is integrated within the MITC (220) to support different types of IHSs, in which the UCC-integrated MITC is manufactured as a monolithic system. This implies that the UCC (240) is not a separate, standalone component.

In one or more embodiments, the UCC (240) may include one or more physical devices (e.g., panels, units, switchboards, etc.) that may provide functionality, for example (but not limited to): to detect a temperature within a system, to detect fire/smoke within a system, to suppress fire/smoke within a system, to provide an access control to a component, to manage a power distribution to a component, to manage a temperature within a system, etc.

The aforementioned example is not intended to limit the scope of the invention.

In one or more embodiments, the UCC (240) may include an environmental control component (ECC) control panel (not shown) that is configured to manage a temperature within the system (e.g., 100, FIG. 1) and to provide heating and/or cooling control services. The heating and/or cooling control services may include, for example (but not limited to): (i) obtaining information relating to a temperature of one or more components within the system (e.g., 100, FIG. 1), where the information may be obtained through a number of temperature sensors (discussed below) within the system (e.g., 100, FIG. 1), (ii) determining whether the temperature within the system (e.g., 100, FIG. 1) is below or above an appropriate operating temperature level (e.g., above 0° C.), (iii) initiating, based on the determination in (ii), a heating process (e.g., activating a heater component within a MECC (210)) to bring the IHSs (230A, 230B) into their designed operating temperature levels, (iv) initiating, based on the determination in (ii), a cooling process (e.g., activating a fluid mixture unit within the MECC (210)) to bring the IHSs (230A, 230B) into their designed operating temperature levels, (v) preventing damage (e.g., thermal runaway) to the heater component in the event of overheating, etc.

While described as a physical device, the ECC control panel may be implemented as a logical entity (e.g., a program executing using a number of printed circuit board components (not shown)). For example, an IHS (e.g., 230A) may host a program that provides the functionality of the ECC control panel.

In one or more embodiments, the ECC control panel may include one or more temperature sensors. The ECC control panel may include other types of sensors (e.g., humidity sensors, vibration sensors, corrosion sensors, differential pressure sensors, etc.) without departing from the scope of the invention. In one or more embodiments, one end of a temperature sensor may be operatively connected to at least one of the components (e.g., IHSs (230A, 230B)) within the system (e.g., 100, FIG. 1) to detect a temperature within the system (e.g., 100, FIG. 1). The other end of the temperature sensor may be operatively connected to the ECC control panel, in which the ECC control panel is configured to manage the components based on the temperature within the system (e.g., 100, FIG. 1).

In one or more embodiments, the UCC (240) may include a power distribution control unit (not shown) that is configured to determine which component(s) within the system (e.g., 100, FIG. 1) receive power from a modular power supply component (not shown). For example, when the heater component needs to be activated, the modular power supply component may be instructed (e.g., by the power distribution control unit) to distribute power to the heater component. As yet another example, the modular power supply component may be instructed to distribute power to the IHSs (230A, 230B).

In one or more embodiments, the modular power supply component may be designed by considering geographic factors of the customer site and custom requirements of the customer. The factors and the requirements may include, for example (but not limited to): a hurricane rating of a location, a required number of UPSs to support an operation, a required number of physical devices in a MECC, a required resiliency of a MECC, a required input power frequency, a required input voltage, etc.

The aforementioned examples are not intended to limit the scope of the invention.

In one or more embodiments, the modular power supply component may obtain customer facility's power (which comes from a centralized power station) and then may distribute the power (i.e., provide the power) to one or more components of the system (e.g., 100, FIG. 1).

In one or more embodiments, the modular power supply component may provide DC power to the components. The modular power supply component may include functionality to convert AC power (obtained from the centralized power station) to DC power.

In one or more embodiments, the modular power supply component may provide "N" or "2×N" power supply resiliency. In one or more embodiments, "N" resiliency may refer to having an exact number of components to operate. For example, if the system (e.g., 100, FIG. 1) needs "N" components to operate and if the system (e.g., 100, FIG. 1) has "N" components, this means that the system (e.g., 100, FIG. 1) has "N" resiliency. As yet another example, if the system (e.g., 100, FIG. 1) has "2×N" power supply resiliency, this means that the modular power supply component has a functionality to provide twice the amount of power needed for the system (e.g., 100, FIG. 1).

Further, if the modular power supply component provides a single power supply feed, then the system (e.g., 100, FIG. 1) will have a low level of resiliency. If there is an additional power supply feed (e.g., a separate busway), then the system (e.g., 100, FIG. 1) will have a high level of resiliency. Having an additional power capacity (e.g., having a redundant UPS, having a redundant battery, etc.) may ensure that the system (e.g., 100, FIG. 1) has no downtime while performing a service maintenance or experiencing a failure (e.g., a hardware failure, a software failure, etc.).

In one or more embodiments, apart from the modular power supply component, the power distribution control unit may include one or more backup power resources (e.g., batteries) to support an uninterrupted service (e.g., a temperature detection service, a power distribution management service, etc.) of the UCC (240).

In one or more embodiments, the UCC (240) may also include an access control unit (not shown) that is configured to control one or more security devices that are placed at various locations on the system (e.g., 100, FIG. 1). In one or more embodiments, a security device may be, for example (but not limited to): a padlock, a badge reader, an electrified mortise lock, a biometric reader-based access contact, etc. By using, for example, a biometric reader-based access contact, the access control unit may control access provided by access doors (ADs, discussed below) (258A-258C).

The aforementioned example is not intended to limit the scope of the invention.

In one or more embodiments, the access control unit may include a blank space (with power) to plug-in third-party security devices. If a customer has an existing security system at a customer site, the customer may install (e.g., mount) the existing security system within the blank space. In this manner, the customer may have a flexibility to use built-in security devices of the UCC (240) and/or to use the existing security system for access control.

As used herein, "mounting" a particular component on another component refers to positioning the particular component to be in physical contact with the other component, such that the other component provides structural support, positioning, structural load transfer, stabilization, shock absorption, some combination thereof, or the like with regard to the particular component.

Those skilled in the art will appreciate that while the IHSs (230A, 230B) and the UCC (240) are shown as located on a particular side of the MITC (220), the IHSs (230A, 230B) and the UCC (240) may be located on any other side of the MITC (220) without departing from the scope of the invention.

In one or more embodiments, the MITC (220) includes the AD (258A). Similarly, the UCC (240) includes the AD (258B). In one or more embodiments, the ADs (258A, 258B) may be walk-in doors or walk-up doors. For example, as a walk-in door, the AD (258A) may permit user access to the UCC (240). As yet another example, as a walk-in door, the AD (258B) may permit user access to an internal environment of the MITC (220).

The aforementioned examples are not intended to limit the scope of the invention.

In one or more embodiments, a walk-up door may be a mechanical "reach through" structure, in which "walk-up" refers to not being able to walk inside of, for example, the MECC (210). Said another way, the walk-up door (258C) has not enough space for a customer to step inside of the MECC (210). However, using the walk-up door (258C), the customer may access substantially a portion of an ECC (e.g., a direct expansion (DX) coil (245)) to perform a service type of event.

In one or more embodiments, the service type of event may include, for example (but not limited to): changing an actuator, changing a filter, changing a sensor, etc. In one or more embodiments, because the customer not being able to walk inside of the MECC (210), the customer may perform the event while standing outside of the MECC (210).

The aforementioned examples are not intended to limit the scope of the invention.

In one or more embodiments, a walk-in door may be a mechanical "walk through" structure, in which "walk-in" refers to being able to walk inside of, for example, the MECC (210) to perform at least a service type of event. In one or more embodiments, the walk-in door has a greater depth than the walk-up door. Said another way, the walk-in door has enough space (e.g., a walk-in space) for a customer to step inside of the walk-in door.

In one or more embodiments, for example, the AD (258A) includes a handle (not shown) that makes easier to open or close the AD (258A) to walk through or reach through the internal environment of the MITC (220). In this manner, the customer may perform a service type of event without standing outside of the MITC (220).

The aforementioned example is not intended to limit the scope of the invention.

In one or more embodiments, the ADs (258A-258C) may be wicket doors (e.g., a door in a door), in which the ADs (258A-258C) both include a person door and a rack door. This means that the ADs (258A-258C) are big enough to pass a rack (not shown) through the ADs (258A-258C). In one or more embodiments, dotted arcs show an inward rotation or an outward rotation of the ADs (258A-258C).

Those skilled in the art will appreciate that while the ADs (258A, 258B) are shown as located on a rear side of the MITC (220) and a front side of the UCC (240), respectively, the ADs (258A, 258B) may be located on any other side of the MITC (220) and the UCC (240) without departing from the scope of the invention.

In one or more embodiments, the MITC (220) includes a connection interface, in which the connection interface is affixed to a pairing end of the MITC (220). The pairing end of the MITC (220) refers to a portion of the MITC (220) that can be paired with another component (e.g., the MECC (210)). In one or more embodiments, the connection interface of the MITC (220) includes mechanical and electrical connection components (MECCOMs) (250B). The connection interface of the MITC (220) also includes built-in airflow connection components (discussed below). Additional details of the MECCOMs are described below in reference to FIGS. 3.1-3.3.

In one or more embodiments, an area (e.g., height×width) enclosed by the connection interface of the MITC (220) is equal to an area enclosed by a connection interface of the MECC (210) (discussed below). In this manner, an end-to-end pairing between the MITC (220) and the MECC (210) may be installed for compatible mechanical, electrical, and airflow connections.

The MECC (210) may include one or more physical devices (e.g., ECCs) that alter characteristics (e.g., airflow directions, humidity of air, and temperature levels, etc.) of the internal environment of the MITC (220) at a macroscopic level. The physical devices may also ensure reliability of the IHSs (230A, 230B) and the UCC (240). In one or more embodiments, the physical devices may be affixed to a floor (e.g., a bottom side) of the MECC (210). In one or more embodiments, a physical device may be, for example (but not limited to): a fan (255), a DX coil (245), a fluid mixture unit, a heater component, an immersion cooling component, etc.

The aforementioned example is not intended to limit the scope of the invention.

In some cases, the system (e.g., 100, FIG. 1) may be deployed to environments that result in the temperature levels of the IHSs (230A, 230B) and the UCC (240) being outside of their designed operating temperature levels. For example, the IHSs (230A, 230B) may be designed to operate at temperature levels above 0° C. When the system (e.g., 100, FIG. 1) is deployed to an environment with harsh conditions (e.g., −40° C.-60° C.), the IHS (230A, 230B) may not operate properly and, in certain scenarios, may be damaged. To prevent the aforementioned issue, depending on environmental conditions, the physical devices either cool or heat the internal environment of the MITC (220). In this manner, stability and functionality of the IHSs (230A, 230B) and the UCC (240) may be preserved.

In one or more embodiments, as a gas mover, the fan (255) may be able to change a rate of gases being taken into and expelled from the IHSs (230A, 230B) and the UCC (240). As a refrigerant-based cooling technology, the DX coil (245) may cool the internal environment of the MITC (220) using a condensed refrigerant liquid (e.g., liquid nitrogen, hydrofluorocarbons (HFCs), etc.). In this technology, the refrigerant may expand to generate a cooling effect in the DX coil (245) that is in direct contact with a conditioned air, which will be supplied to the internal environment of the MITC (220).

In one or more embodiments, as a liquid cooling component, the fluid mixture unit may pump cooled fluid mixture (e.g., a mixture of water and glycerol) throughout hardware components (not shown) of the IHSs (230A, 230B) and the UCC (240). An absorbed air by the fluid mixture may then be transferred to an external environment of the MITC (220). Similar to refrigerant-based cooling technology, the fluid mixture unit may also use a DX coil; however, instead of using a refrigerant, the fluid mixture unit uses the fluid mixture. In one or more embodiments, glycerol may behave like an antifreeze liquid, in which the fluid mixture may operate at temperatures below 0° C.

In one or more embodiments, the MECC (210) may also take advantage of a cooling infrastructure that is already built-in at a customer site. For example, the MECC (210) may use a chilled water loop that is already available at the customer site.

As used herein, an "infrastructure" means system, components, or elements of a system that provide resources for a computing device, such as electrical power, data exchange capability with external systems, air, heat removal, and environmental control.

In one or more embodiments, the heater component may bring hardware components of the IHSs (230A, 230B) and the UCC (240) into their appropriate operating temperature levels (e.g., above 0° C.) when necessary. To initiate a heating process, the heater component may obtain a required power from the modular power supply component. The heater component may be made of silicon rubber, any other material, and/or any combination thereof that enables the heater component to perform its functions. Those skilled in the art will appreciate that the heater component may be supplied with power directly or indirectly (e.g., via a heating control component, a printed circuit board, etc.) without departing from the scope of the invention.

In one or more embodiments, the heater component has a number of surfaces that is heated and when air passes through the surfaces, an induced heat may be transferred from the heater component to the volume of air drawn into the internal environment of the MITC (220). In one or more embodiments, a number of heat sinks (not shown) may be used to provide a uniform distribution of heated volume of air drawn into the internal environment of the MITC (220) through their fins, in which a bottom portion of the number of heat sinks is affixed to the heater component. In this manner, a surface area of the heater component may be expanded indirectly to increase an efficiency of the heater component.

In one or more embodiments, the airflow connection components may be ducting components that allow using either standard or custom designed MECCs. The airflow connection components may change (e.g., twist) a direction of an airflow formed between the MECC (210) and the MITC (220). For example, the MECC (210) may include a cold air ducting component and a hot air ducting component. The cold air ducting component may supply cold air into the MITC (220). The hot air ducting component may remove hot air from the MITC (220) and may deliver the hot air to the MECC (210).

The aforementioned example is not intended to limit the scope of the invention.

As used herein, a "ducting component" includes any tube, pipe, conduit, or a combination thereof, that has one or more passageways through which a fluid or a gas can be conveyed. Examples of materials for a ducting component may include a cloth, a fabric, an extruded metal, a sheet metal, a polymer, or a combination thereof. A passageway of a ducting component may have any size and shape. The cross-section of a ducting component may be square, round, ovate, rectangular, or irregular. Further, a passageway of a ducting component may have a constant or changing cross-section, or a cross-section that changes over the length of the passageway.

In one or more embodiments, the MECC (210) may provide "N+1" or "N+2" heating and/or cooling resiliency. In one or more embodiments, "N+1" cooling resiliency may indicate that even if one of the physical devices is deactivated (because of a service maintenance), the IHSs (230A, 230B) may still operate. For example, the MECC (210) has four fans and the MECC (210) has "N+1" resiliency. In this case, the required number of fans to support operation of the IHSs (230A, 230B) is three and the MECC (210) has a redundant fan. Having additional heating and/or cooling capacity (e.g., having a redundant fan, having a redundant heater component, etc.) may ensure that the IHSs (230A, 230B) has no downtime while performing a service maintenance or experiencing a failure.

In one or more embodiments, a power usage effectiveness (PUE) value of a component (e.g., an ECC, an IHS, etc.) at a data center indicates how energy efficient the component is. For example, as an ideal case, if a PUE value of an ECC is equal to one, this means that the ECC uses 100% of an input power that is provided to the ECC. In general, a PUE value of an ECC at a traditional data center is on average 1.57 (e.g., 64% effectiveness). Comparing to the PUE value of the ECC at the traditional data center, a PUE value of the MECC (210) is on average 1.01 (e.g., 99% efficiency)-1.043 (e.g., 95% efficiency), depending on where the system (e.g., 100, FIG. 1) is deployed. For example, if the system (e.g., 100, FIG. 1) is deployed to a hot environment (e.g., Phoenix, AZ), the PUE value of the MECC (210) may be 1.043. As yet another example, if the system (e.g., 100, FIG. 1) is deployed to a mild (e.g., neither hot nor cold) environment (e.g. San Diego, CA), the PUE value of the MECC (210) may be 1.01.

The aforementioned example is not intended to limit the scope of the invention.

In one or more embodiments, the MECC (210) supplies cold air (shown with a dashed line arrow) to the internal environment of the MITC (220) (including the UCC (240)) via the built-in airflow connection components. The MECC (210) also removes hot air (shown with a solid line arrow) from the internal environment of the MITC (220) (including the UCC (240)) via the built-in airflow connection components. In one or more embodiments, the dashed line and the solid line arrows inside of the MITC (220) may be referred to as a "cold aisle" and a "hot aisle", respectively.

The cold aisle may refer to an area (e.g., a space) in which conditioned (e.g., cold) air is introduced to a front side of the IHSs (230A, 230B) and to the UCC (240) to remove heat. The cold air may also be introduced to other components located within the internal environment of the MITC (220) without departing from the scope of the invention.

The hot aisle may refer to an area in which conditioned (e.g., hot) air is removed from a rear side of the IHSs (230A, 230B) and from the UCC (240) for the reliability of the IHSs (230A, 230B) and the UCC (240). The hot air may also be removed from other components located within the internal environment of the MITC (220) without departing from the scope of the invention.

In one or more embodiments, similar to MITC (220), the MECC (210) includes the AD (258C). In one or more embodiments, the AD (258C) may be a walk-in door or a walk-up door (as discussed above). For example, as a walk-in door, the AD (258C) may permit user access to the MECC (210).

The aforementioned example is not intended to limit the scope of the invention.

Those skilled in the art will appreciate that while the AD (258C) is shown as located on a right side of the MECC (210), the AD (258C) may be located on any other side of the MECC (210) without departing from the scope of the invention.

In one or more embodiments, as being separate components and as having separate ADs, once paired, the MITC (220) and the MECC (210) provide an additional security measure to the user access. For example, user 1 has access to the AD (258C) and user 2 has access to the ADs (258A-258C). In this case, because user 2 has access to all ADs, user 2 can access to the UCC (240), the MITC (220), and the MECC (210). However, because user 1 has access only to the AD (258C), user 1 cannot access to the UCC (240) and to the MITC (220).

The aforementioned example is not intended to limit the scope of the invention.

In one or more embodiments, similar to the MITC (220), the MECC (210) includes a connection interface, in which the connection interface is affixed to a pairing end of the MECC (210). The pairing end of the MECC (210) refers to a portion of the MECC (210) that can be paired with another component (e.g., the MITC (220)). In one or more embodiments, similar to the MITC (220), the connection interface of the MECC (210) includes MECCOMs (250A). The connection interface of the MECC (210) also includes the built-in airflow connection components.

In one or more embodiments, the MITC (220) and the MECC (210) are oriented in a same direction. Further, a double-headed arrow shows modularity of the system (e.g., 100, FIG. 1), in which the MECC (210) may be attached to, or detached from the MITC (220) along the same direction.

Those skilled in the art will appreciate that while the IHSs (230A, 230B) are oriented in parallel to the MECCOMs (250B), the IHSs (230A, 230B) may be oriented in any direction without departing from the scope of the invention.

In one or more embodiments, the MITC (220) includes one or more scaffolds (e.g., walls, structural skeletons, frameworks, etc.) (257A-257D), in which the scaffolds (257A-257D) may provide structural support to components of the MITC (220). For example, scaffolds (257B, 257C) provide structural support to a doorframe (not shown) of the AD (258A). As yet another example, scaffolds (257A, 257D) are a part of the pairing end of the MITC (220), in which the scaffolds (257A, 257D) may include at least a portion of the MECCOMs (250B).

In one or more embodiments, similar to the MITC (220), the MECC (210) includes one or more scaffolds (256A-256D), in which the scaffolds (256A-256D) may provide structural support to components of the MECC (210). For example, scaffolds (256C, 256D) provide structural support to a doorframe (not shown) of the AD (258C). As yet another example, scaffolds (256A, 256D) are a part of the pairing end of the MECC (210), in which the scaffolds (256A, 256D) may include at least a portion of the MECCOMs (250A).

The aforementioned examples are not intended to limit the scope of the invention.

In one or more embodiments, while the end-to-end pairing between the MITC (220) and the MECC (210) is being formed, the scaffolds (257A, 257D) needs to be connected to the scaffolds (256A, 256D), respectively, for compatible mechanical, electrical, and airflow connections. Additional details of the end-to-end pairing are described below in reference to FIGS. 3.1-3.3.

In one or more embodiments, "connected" may refer to "directly connected", in which there is a seal in between, for example, (i) the scaffold (256A) and the scaffold (257A), and (ii) the scaffold (256D) and the scaffold (257D).

Alternatively, "connected" may refer to "connected via one or more physical components in between". For example, the scaffold (256A) is connected to the scaffold (257A), in which at least one physical component is mechanically touching the scaffold (256A) and the scaffold (257A).

In one or more embodiments, the end-to-end and medium form factor (e.g., medium shape) of the MDC (the system (e.g., 100, FIG. 1)) described in FIGS. 1 and 2.1 makes the system (e.g., 100, FIG. 1) deployable to, for example (but not limited to): space-unlimited locations, remote locations, etc. The space-unlimited locations may be, for example (but not limited to): university campuses, research and development locations, etc. The remote locations (e.g., edge locations) may be locations that are away from specialized IT and security personnel to maintain an operation of the MDC.

Providing multiple functionalities and fitting these functionalities into the medium form factor make formation, deployment, and operation of the end-to-end MDC easier for a customer that needs higher computing power. These functionalities also make possible to move from centralized cloud computing to decentralized edge computing. These functionalities may include, for example (but not limited to): a pre-integrated and ready-to-use IHS, an ability to plug into an existing security system, multiple ECC options, a high power resiliency, an optimized power distribution, higher power density within a data center, an easy service access, flexibility to support third-party components, a customer-specific component design, etc.

Further, a physical and functional split between the MECC (210) and the MITC (220) enables a variety of cooling technologies, capacities, and resiliencies to be paired with a variety of power capacities, resiliencies, and IHS technologies.

Turning now to FIG. 2.2, FIG. 2.2 shows a top view of a system in accordance with one or more embodiments of the invention. The system includes one or more MITCs (260A, 260B), one or more MECCs (264A-264C), and a modular UCC (MUCC) (266). The system may include additional, fewer, and/or different modular building blocks without departing from the scope of the invention. Each component illustrated in FIG. 2.2 is described below.

In comparison to the system (100) shown in FIG. 1, the system shown in FIG. 2.2 represents a large form factor MDC that provides additional functionalities (e.g., scalability over time) with higher computing power and higher power density.

In an embodiment of the invention shown in FIG. 2.2, the MITC (260A) may be a mechanical structure that enables an IHS (265A) to be disposed within the MITC (260A). Similarly, the MITC (260B) may be a mechanical structure that enables one or more IHSs (265B, 265C) to be disposed within the MITC (260B).

In one or more embodiments, while disposing, the IHSs (265A-265C) may be affixed to floors (not shown) within the MITCs (260A, 260B) via the standard mechanical mechanisms. In one or more embodiments, the floors are affixed to bottom sides of the MITCs (260A, 260B). Other mechanical or non-mechanical mechanisms for affixing the IHSs (265A-265C) to the floors may be used without departing from the scope of the invention.

In one or more embodiments, white spaces within the MITCs (260A, 260B), where the IHSs (265A-265C) are located, may have a functionality to host different types of standard racks (e.g., 4×750 mm wide racks, 5×600 mm wide racks, etc.). The white spaces may also have a functionality to host custom designed racks. Both standard and custom designed racks may be pre-integrated into the floors before transportation to the customer site.

In one or more embodiments, apart from hosting the IHSs (265A-265C), the white spaces may also host other components, for example (but not limited to): immersion tanks, UPSs, battery racks, cable management towers, etc.

In one or more embodiments, the MITCs (260A, 260B) may be implemented as other types of structures adapted to host, position, orient, and/or otherwise physically, mechanically, electrically, and/or thermally manage the IHSs (265A-265C). In this manner, the MITCs (260A, 260B) may enable the IHSs (265A-265C) to be densely packed without negatively impacting the operation of the IHSs (265A-265C).

In one or more embodiments, as opposed to being integrated an inside of the MITC (260A) or an inside of the MITC (260B), the MUCC (266) is manufactured as a separate component. In this manner, the MUCC (266) may support one or more components at the same time. For example, the MUCC (266) may include a shared power supply component (not shown), in which the shared power supply component may have a functionality (e.g., a higher power capacity, a dynamic power distribution capability, etc.) to support the MITCs (260A, 260B) and MECCs (264A-264C) at the same time.

In one or more embodiments, MUCC (266) may be a standard MUCC. However, depending on how many components need to be supported, or, depending on a customer requirement, a size of the MUCC (266) may be expanded. For example, supporting four MITCs (rather than supporting two MITCs) needs a larger shared power supply component. For this reason, the size of the MUCC (266) needs to be expanded to host the larger shared power supply component.

The aforementioned examples are not intended to limit the scope of the invention.

In one or more embodiments, in addition to the MUCC (266), the system may provide one-to-one power architecture, in which each of the MITCs (260A, 260B) and/or the MECCs (264A-264C) may have a separate power supply component (e.g., a UPS, a battery, a transformer, etc.). For example, the MITC (260A) may need a larger current rating and a higher battery runtime to perform a complex task (e.g., a data migration from a distributed computing system). In this case, the power supply component of the MITC (260A) may provide an additional power to the MITC (260A).

The aforementioned examples are not intended to limit the scope of the invention.

In one or more embodiments, (i) the MITC (260A) includes ADs (261H, 261I), (ii) the MITC (260B) includes ADs (261A, 261B), and (iii) the MUCC (266) includes ADs (261E-261G). In one or more embodiments, the ADs (261A, 261B, and 261E-261I) may be walk-in doors or walk-up doors. For example, as a walk-in door, the AD (261I) may permit user access to an internal environment of the MITC (260A). As yet another example, as a walk-in door, the AD (261G) may permit user access to an internal environment of the MUCC (266).

The aforementioned examples are not intended to limit the scope of the invention.

Those skilled in the art will appreciate that while the ADs (261A, 261B, and 261E-261I) are shown as located on a particular side of the MITCs (260A, 260B) and the MUCC (266), the ADs (261A, 261B, and 261E-261I) may be located on any other side of the MITCs (260A, 260B) and the MUCC (266) without departing from the scope of the invention.

In one or more embodiments, the MITC (260A) includes a connection interface, in which the connection interface is affixed to a first pairing end of the MITC (260A). The first pairing end of the MITC (260A) refers to a portion of the MITC (260A) that can be paired in parallel with another component (e.g., the MUCC (266)). In one or more embodiments, the connection interface of the MITC (260A) includes MECCOMs (262A). The connection interface of the MITC (260A) also includes the built-in airflow connection components.

Further, the MITC (260A) includes an interposer (263B), in which the interposer (263B) is affixed to a second pairing end of the MITC (260A). The second pairing end of the MITC (260A) refers to a portion of the MITC (260A) that can be paired perpendicularly with another component (e.g., the MECC (264A)).

In one or more embodiments, the interposer (263B) includes electrical, mechanical, and airflow connection components (EMACCOMs). In one or more embodiments, the interposer (263B) may provide functionality to connect a standard or a third-party MECC to the MITC (260A).

In one or more embodiments, similar to the MITC (260A), the MITC (260B) includes a connection interface, in which the connection interface is affixed to a first pairing end of the MITC (260B). In one or more embodiments, the connection interface of the MITC (260B) includes MECCOMs (262D). The connection interface of the MITC (260B) also includes the built-in airflow connection components.

Further, similar to the MITC (260A), the MITC (260B) includes interposers (263D, 263F), in which the interposers (263D, 263F) are affixed to second and third pairing ends of the MITC (260B), respectively.

In one or more embodiments, the MUCC (266) includes one or more connection interfaces, in which each of the connection interfaces is affixed to one of the pairing ends of the MUCC (266). In one or more embodiments, a first connection interface of the MUCC (266) includes MECCOMs (262B). Similarly, a second connection interface of the MUCC (266) includes MECCOMs (262C). Both connection interfaces of the MUCC (266) also include the built-in airflow connection components.

In one or more embodiments, an area enclosed by the connection interface of the MITC (260A) is equal to an area enclosed by the first connection interface of the MUCC (266). In this manner, an end-to-end pairing between the MITC (260A) and the MUCC (266) may be installed for compatible mechanical, electrical, and airflow connections. Similarly, an area enclosed by the connection interface of the MITC (260B) is equal to an area enclosed by the second connection interface of the MUCC (266). In this manner, an end-to-end pairing between the MITC (260B) and the MUCC (266) may be installed for compatible mechanical, electrical, and airflow connections.

The MECC (264A) may include one or more physical devices that alter characteristics of an internal environment of the MITC (260A) and the MUCC (266) at a macroscopic level. The physical devices may also ensure reliability of the IHS (265A) and the MUCC (266). In one or more embodiments, the physical devices may be affixed to a floor of the MECC (264A).

In one or more embodiments, the MECC (264A) supplies cold air (shown with dashed line arrows) to the internal environment of the MITC (260A) (including the MUCC (266)) via the interposers (263A, 263B). The MECC (264A) also removes hot air (shown with solid line arrows) from the internal environment of the MITC (260A) (including the MUCC (266)) via the interposers (263A, 263B). In one or more embodiments, the dashed line and the solid line arrows inside of the MITC (260A) may be referred to as a cold aisle and a hot aisle, respectively. Details of the cold aisle and the hot aisle are described above in reference to FIG. 2.1.

In one or more embodiments, the interposer (263A) is affixed to a pairing end of the MECC (264A). In one or more embodiments, the MECC (264A) includes an AD (261J), in which the AD (261J) may be a walk-in door or a walk-up door. For example, as a walk-in door, the AD (261J) may permit user access to an internal environment of the MECC (264A).

The aforementioned example is not intended to limit the scope of the invention.

Those skilled in the art will appreciate that while the AD (261J) is shown as located on a rear side of the MECC (264A), the AD (261J) may be located on any other side of the MECC (264A) without departing from the scope of the invention.

In one or more embodiments, the interposer (263B) includes components that allow to connect to either standard or custom designed MECCs. In one or more embodiments, the interposers (263A, 263B) include airflow connection components that may twist a direction of an airflow formed between the MECC (264A) and the MITC (260A). For example, the interposers (263A, 263B) may include a bottom ducting component and an overhead ducting component. The bottom ducting component may supply cold air into the MITC (260A). The overhead ducting component may remove hot air from the MITC (260A) and may deliver the hot air to the MECC (264A).

In one or more embodiments, an area of the interposer (263A) is equal to an area of the interposer (263B). In this manner, an end-to-end pairing between the MITC (260A) and the MECC (264A) may be installed for compatible mechanical, electrical, and airflow connections.

In one or more embodiments, the MECC (264B) includes an interposer (263C), in which the interposer (263C) is affixed to a pairing end of the MECC (264B). Similarly, the MECC (264C) includes an interposer (263E), in which the interposer (263E) is affixed to a pairing end of the MECC (264C).

In one or more embodiments, the MECC (264B) also includes an AD (261C) and the MECC (264C) also includes an AD (261D). In one or more embodiments, the ADs (261C, 261D) may be walk-in doors or walk-up doors. For example, as a walk-in door, the AD (261C) may permit user access to an internal environment of the MECC (264B).

The aforementioned example is not intended to limit the scope of the invention.

Those skilled in the art will appreciate that while the AD (261C) is shown as located on a right side of the MECC (264B) and the AD (261D) is shown as located on a rear side of the MECC (264C), the ADs (261C, 261D) may be located on any other side of the MECCs (264B, 264C) without departing from the scope of the invention.

In one or more embodiments, an area of the interposer (263C) is equal to an area of the interposer (263D). Similarly, an area of the interposer (263E) is equal to an area of the interposer (263F). In this manner, an end-to-end pairing between the MITC (260B) and the MECCs (264B, 264C) may be installed for compatible mechanical, electrical, and airflow connections.

In one or more embodiments, similar to the MECC (264A), the MECCs (264B, 264C) may include one or more physical devices that alter characteristics of the internal environment of the MITC (260B) and the MUCC (266) at a macroscopic level. The physical devices may also ensure reliability of the IHSs (265B, 265C) and the MUCC (266). In one or more embodiments, the physical devices may be affixed to floors of the MECCs (264B, 264C).

In one or more embodiments, similar to the MECC (264A), the MECCs (264B, 264C) supply cold air (shown with dashed line arrows) to the internal environment of the MITC (260B) (including the MUCC (266)) via the interposers (263C-263F). The MECCs (264B, 264C) also remove hot air (shown with solid line arrows) from the internal environment of the MITC (260B) (including the MUCC (266)) via the interposers (263C-263F). In one or more embodiments, the dashed line and the solid line arrows inside of the MITC (260B) may be referred to as a cold aisle and a hot aisle, respectively.

In one or more embodiments, the interposers (263D, 263F) include components that allow to connect to either standard or custom designed MECCs. In one or more embodiments, the interposers (263C-263F) include airflow connection components that may twist a direction of an airflow formed between the MECCs (264B, 264C) and the MITC (260B). For example, the interposers (263C-263F) may include a bottom ducting component and an overhead ducting component. The bottom ducting component may supply cold air into the MITC (260B). The overhead ducting component may remove hot air from the MITC (260B) and may deliver the hot air to the MECCs (264B, 264C).

In one or more embodiments, depending on structural (e.g., a size), locational (e.g., being located in a harsh environment), and performance (e.g., an ability to perform complex tasks) characteristics of the MITCs (260A, 260B), the MITCs (260A, 260B) may be connected to additional MECCs.

In one or more embodiments, the MITCs (260A, 260B) and the MUCC (266) are oriented in a first direction, and the MECCs (264A-264C) are oriented in a second direction, in which the first direction and the second direction are perpendicular to each other. The MITCs (260A, 260B), the MUCC (266), and the MECCs (264A-264C) may be oriented differently with respect to each other without departing from the scope of the invention.

In one or more embodiments, perpendicularly oriented double-headed arrows show the modularity of the system, in which the MECCs (264A-264C) may be attached to, or detached from the MITCs (260A, 260B). Similarly, remaining double-headed arrows also show the modularity of the system, in which the MUCC (266) may be attached to, or detached from the MITCs (260A, 260B).

In one or more embodiments, rather than being perpendicularly oriented with the MITC (260A), the MECC (264A) may be placed (e.g., stacked) on top of the MITC (260A). Similarly, rather than being perpendicularly oriented with the MITC (260B), the MECCs (264B, 264C) may be stacked on top of the MITC (260B). In this manner, the modularity of the system can be further improved.

Further, a physical and functional split between the MECCs (264A-264C), the MITCs (260A, 260B), and the MUCC (266) enables a variety of cooling technologies, capacities, and resiliencies to be paired with a variety of power capacities, resiliencies, MUCC, and IHS technologies.

Those skilled in the art will appreciate that while the IHSs (265A-265C) are shown as located on a particular side of the MITCs (260A, 260B), the IHSs (265A-265C) may be located on any other side of the MITCs (260A, 260B) without departing from the scope of the invention.

Those skilled in the art will appreciate that while the IHSs (265A-265C) are oriented in parallel to the MECCOMs (262A, 262D), the IHSs (265A-265C) may be oriented in any direction without departing from the scope of the invention.

In one or more embodiments, the MITC (260A) includes one or more scaffolds (267A, 267B), in which the scaffolds (267A, 267B) may provide structural support to components of the MITC (260A). For example, the scaffolds (267A, 267B) are a part of the first pairing end of the MITC (260A), in which the scaffolds (267A, 267B) may include at least a portion of the MECCOMs (262A). As yet another example, the scaffold (267A) is a part of the second pairing end of the MITC (260A), in which the scaffold (267A) may include at least a portion of the EMACCOMs of the interposer (263B).

In one or more embodiments, similar to the MITC (260A), the MITC (260B) includes one or more scaffolds (269A, 269B), in which the scaffolds (269A, 269B) may provide structural support to components of the MITC (260B). For example, the scaffolds (269A, 269B) are a part of the first pairing end of the MITC (260B), in which the scaffolds (269A, 269B) may include at least a portion of the MECCOMs (262D). As yet another example, the scaffold (269A) is a part of the second and third pairing ends of the MITC (260B), in which the scaffold (269A) may include at least a portion of the EMACCOMs of the interposers (263D, 263F).

The aforementioned examples are not intended to limit the scope of the invention.

In one or more embodiments, for example, while the end-to-end pairing between the MITC (260A) and the MECC (264A) is being formed, the scaffold (267A) needs to be connected to one or more scaffolds (not shown) of the MECC (264A) for compatible mechanical, electrical, and airflow connections.

In one or more embodiments, similar to the MITC (260A), the MUCC (266) and the MECCs (264A-264C) include one or more scaffolds (e.g., 268A, 270A, and, 271A, etc.). The scaffolds (e.g., 268A, 270A, and, 271A, etc.) may have the same functionalities (discussed above) as the scaffolds (267A, 267B) of the MITC (260A).

In one or more embodiments, the end-to-end and large form factor of the MDC (the system) described in FIG. 2.2 makes the system suitable for larger workloads (e.g., parallel processing computation in a distributed computing system) and deployable to, for example (but not limited to): space-unlimited locations, remote locations, etc.

Providing multiple functionalities and fitting these functionalities into the large form factor make formation, deployment, and operation of the end-to-end MDC easier for a customer that needs higher computing power, higher power density, and scalability. These functionalities also make possible to move from centralized cloud computing to decentralized edge computing and to add or remove components from the large form factor MDC center over time. These functionalities may include, for example (but not limited to): a pre-integrated and ready-to-use IHS, an ability to plug into an existing security system, multiple ECC options, a high ECC resiliency, an optimized power distribution, higher power density within a data center, an easy service access, flexibility to support third-party components, customer-specific component design, scalability over time, etc.

Turning now to FIG. 2.3, FIG. 2.3 shows a diagram of the IHS (230A) in accordance with one or more embodiments of the invention. The IHS (230A) may include a rack (280) and any number of computing devices (e.g., 290).

In one or more embodiments, the rack (280) may be a mechanical structure that enables the computing devices to be positioned with respect to one another. For example, the rack (280) may be a mountable enclosure that enables the computing devices to be disposed within the rack (280). The rack (280) may be implemented as other types of structures adapted to host, position, orient, and/or otherwise physically, mechanically, electrically, and/or thermally manage the computing devices. By managing the computing devices, the rack (280) may enable the computing devices to be densely packed in a space without negatively impacting the operation of the IHS (230A).

In one or more embodiments, a computing device (e.g., 290) may be a mechanical structure for housing components of the IHS (230A). For example, the computing device (e.g., 290) may be implemented as a rack-mountable enclosure for housing components of the IHS (230A). The computing device (e.g., 290) may be adapted to be disposed within the rack (280) and/or utilize services provided by the rack (280) and/or other components available in the system (e.g., 100, FIG. 1).

In one or more embodiments, a computing device positioned into a pre-integrated rack may be ready-to-use (e.g., pre-configured with software, hardware, etc.) when deployed to the customer site. However, the customer may alter a configuration of the pre-configured computing device after the deployment. For example, the customer may increase memory capacity of the computing device after the deployment. As yet another example, the customer may increase processor capacity of the computing device after the deployment.

The aforementioned examples are not intended to limit the scope of the invention. In one or more embodiments, one or more isolators may be attached to the components (e.g., the IHSs (e.g., 230A, 230B, FIG. 2.1)) of the system (e.g., 100, FIG. 1) to make sure that the components are ready-to-use when they deployed to the customer site. In one or more embodiments, the isolators provide a shock isolation to the components such that the components may be protected from any damage (e.g., a vibrational damage).

Turning now to FIG. 2.4, FIG. 2.4 shows a diagram of the computing device (290) in accordance with one or more embodiments of the invention. In one or more embodiments, the computing device (290) includes six sides (i.e., top, bottom, right, left, front, and rear), in which air drawn into from a front side of the computing device (e.g., via an air inlet (292)) and expelled from the rear side of the computing device (e.g., via one or more ECCs). An airflow direction is shown with a dashed line arrow (cold air) and a solid line arrow (hot air). In general, air incoming from the front side of the computing device (290) is cooler than air outgoing from the rear side of the computing device (290).

In one or more embodiments, to provide services, the computing device (290) may utilize resources provided by a number of hardware components hosted within the computing device (290). The hardware components may be, for example (but not limited to): processors, non-persistent storage devices, printed circuited boards, persistent storage devices, peripheral components interconnects, special purpose hardware components, etc. In one or more embodiments, some of the hardware components may be omitted or additional hardware components may be added based on the services provided by the computing device (290).

The aforementioned example is not intended to limit the scope of the invention.

As used herein, "computing" refers to any operations that may be performed by a computer, including (but not limited to): computation, data storage, data retrieval, communications, etc.

As used herein, a "computing device" includes any of various devices in which a computing operation may be carried out. A computing device may be, for example (but not limited to): a compute IHS component, a storage IHS component, a network device, a telecommunications component, etc.

The aforementioned examples are not intended to limit the scope of the invention. In one or more embodiments, the medium form factor of the system described in FIG. 2.1 and the large form factor of the system described in FIG. 2.2 may increase a PUE value of the computing device (290). For example, because the system described in FIG. 2.1 includes a separate cooling and/or heating unit (210), the computing device (290) may not have a fan and/or a heating component. In this manner, the computing device (290) may become more power dense and power-efficient.

FIGS. 3.1-3.3 show a pairing process of a portion of a connection interface of the MITC (e.g., 220, FIG. 2.1) and a portion of a connection interface of the MECC (e.g., 210, FIG. 2.1) to implement a TEMPEST seal (e.g., a TEMPEST protection) in accordance with one or more embodiments of the invention. Before describing the pairing process, details of the "TEMPEST" code name are described below.

A "sensitive compartmented information facility (SCIF)" is a U.S. Department of Defense term for a secure area (e.g., a secure room, a secure data center, etc.) that provides shielding against (i) electronic surveillance via, for example, external radio frequency (RF) radiation, and (ii) leakage of sensitive information. In general, SCIFs are used to, for example (but not limited to): (i) process sensitive information, (ii) deny unauthorized access (e.g., tampering) of foreign intelligence services or spies, (iii) prevent exploitation of sensitive information through physical, cyber, and technical means, etc.

To provide the aforementioned functionalities, a SCIF must be built based on standards (e.g., requirements) outlined in the "ICD-705 guideline." The requirements may include, for example (but not limited to): mechanical connection requirements, electrical connection requirements, airflow connection requirements, visual requirements, etc.

Regarding the mechanical connection requirements, for example, all of the ADs need to be equipped with two-factor authentication (2FA) access control technology. As yet another example, the ADs, frames of the ADs, and scaffolds of the SCIF need to satisfy sound transmission class (STC) ratings. Regarding the electrical connection requirements, for example, power supply components (e.g., UPSs, batteries, etc.) need to be dedicated to the SCIF. As yet another example, any power supply feed entering into the SCIF needs to be terminated and not travel through the SCIF.

Regarding the airflow connection requirements, for example, all of the ECCs and the ducting need to be equipped with barred barriers to prevent intrusion, with inspection points installed within the SCIF. As yet another example, all breaks of the ducting need to be outfitted with special components to ensure that electromagnetic (EM) emanations do not leave the SCIF. Regarding the visual requirements, the SCIF needs to be designed such that no one can detect what is transpiring inside of the SCIF from any distance. For this reason, the SCIF may be designed without having windows.

As one of the mechanical connection requirements, the SCIF needs to be protected against "transient electromagnetic pulse surveillance technology (TEMPEST)." Using TEMPEST, information in any digital device may be intercepted and reconstructed into useful intelligence (e.g., TEMPEST eavesdropping, EM eavesdropping, etc.). This technology is particularly useful to intercept information stored in computing devices and/or displayed on terminals of the computing devices.

On the other hand, under emission security (EMSEC), the TEMPEST code name also refers to "transient electromagnetic pulse emanation standard" technology related to limiting unwanted EM radiation from computing devices of the SCIF. In this manner, an opponent's (e.g., a spy's) ability to collect information about the internal data flow of the computing devices can be stopped.

The TEMPEST technology is particularly important for computing devices (and other data processing devices) because (i) hardware components of the computing devices use square waves to communicate to each other, and (ii) clock speeds of these hardware components generate a rich set of unintentional emissions (e.g., spurious emissions, unintentional leaks, etc.) along a wide portion of the EM spectrum. Because the unintentional emissions occupy a wide portion of the EM spectrum, methods used to block one portion of the EM spectrum are not necessarily effective in another portion. For this reason, unintentional emissions from a computing device can be captured and processed to reveal data (e.g., personal data, process data, etc.) stored in the computing device. To prevent at least a threat of data loss because of the unintentional emissions, the TEMPEST seal (discussed below) can be implemented in the SCIF (e.g., 100, FIG. 1).

Turning now to FIG. 3.1, FIG. 3.1 shows an initial stage of the pairing process in accordance with one or more embodiments of the invention. In an embodiment of the invention shown in FIG. 3.1, the embodiment includes a first scaffold (325) and a second scaffold (326). The first scaffold (325) may be the same as the scaffold (257A) as discussed above in reference to FIG. 2.1. Similarly, the second scaffold (326) may be the same as the scaffold (256A) as discussed above in reference to FIG. 2.1.

In one or more embodiments, a connection interface of the first scaffold (325) may include a first set of mechanical connection components. The first set of mechanical connection components may include, for example (but not limited to): one or more studs (320A-320C), a first gasket (e.g., a first continuity gasket, a first gasket seal, etc.) (315), and a first sealing adhesive component (310), etc.

The aforementioned example is not intended to limit the scope of the invention.

In one or more embodiments, a connection interface of the second scaffold (326) may include a second set of mechanical connection components. The second set of mechanical connection components may include, for example (but not limited to): one or more studs (320D-320F), a second gasket (not shown), and a second sealing adhesive component (not shown), etc. In one or more embodiments, an area enclosed by the connection interface of the first scaffold (325) is equal to an area enclosed by the connection interface of the second scaffold (326).

The aforementioned example is not intended to limit the scope of the invention.

Those skilled in the art will appreciate that while the studs (320A-320F) are used as mechanical connection components, any other mechanical or non-mechanical components may be used as mechanical connection components without departing from the scope of the invention.

In one or more embodiments, the studs (320A-320C) are located on an outside surface of the first scaffold (325). Said another way, the studs (320A-320C) are located on the outside of the MITC (e.g., 220, FIG. 2.1) (shown with a left brace). In one or more embodiments, the studs (320D-320F) are located on an outside surface of the second scaffold (326). Said another way, the studs (320D-320F) are located on the outside of the MECC (e.g., 210, FIG. 2.1) (shown with the left brace).

Those skilled in the art will appreciate that while the studs (320A-320C) are shown as located on the outside of the MITC (e.g., 220, FIG. 2.1), the studs (320A-320C) may be located on the inside of the MITC (e.g., 220, FIG. 2.1) without departing from the scope of the invention.

Those skilled in the art will appreciate that while the studs (320D-320F) are shown as located on the outside of the MECC (e.g., 210, FIG. 2.1), the studs (320D-320F) may be located on the inside of the MECC (e.g., 210, FIG. 2.1) without departing from the scope of the invention.

In one or more embodiments, when the connection interface of the first scaffold (325) is connected to the connection interface of the second scaffold (326) (shown with a double-headed arrow), the first sealing adhesive component (310) and the second sealing adhesive component provide a seal (e.g., a weather-proofed protection) to at least a portion of the system (e.g., 100, FIG. 1). To further improve the seal, at least the portion of the system (e.g., 100, FIG. 1) may be protected with, for example, silicone sealant and/or latex caulk. In one or more embodiments, a sealing adhesive component may be, for example (but not limited to): a very high bonding (VHB) tape, a butyl tape, etc.

The aforementioned example is not intended to limit the scope of the invention.

In one or more embodiments, the first set of mechanical connection components may further include a first set of mechanical hard-stop components (not shown). Similarly, the second set of mechanical connection components may further include a second set of mechanical hard-stop components (not shown). In one or more embodiments, when the connection interface of the first scaffold (325) is connected to the connection interface of the second scaffold (326), the first set of mechanical hard-stop components and the second set of mechanical hard-stop components permit uniform compression of the first gasket (315) and the second gasket.

In one or more embodiments, the uniform compression of the first gasket (315) and the second gasket closes any gaps, for example, resulting from mechanical tolerances when the connection interfaces are met. In this manner, the uniform compression provides a steady environment for an internal environment of the system (e.g., 100, FIG. 1). Further, the mechanical hard-stop components keep the first scaffold (325) connected to the second scaffold (326), and provide structural support to the first scaffold (325) and to the second scaffold (326) in case of a seismic event.

In one or more embodiments, for further protection from the seismic events, the mechanical connection components may include additional mechanical connection components (e.g., additional constraints). The additional mechanical connection components may be, for example (but not limited to): steel plates with bolted connections, additional mechanical hard-stop components, etc. In one or more embodiments, the additional mechanical connection components may be located inside of or outside of the MITC (e.g., 220, FIG. 2.1) and the MECC (e.g., 210, FIG. 2.1).

In one or more embodiments, a hard-stop component may be, for example (but not limited to): a steel bar, a steel plate, a rigid sealing component, etc. In one or more embodiments, the first gasket (315) and the second gasket may be, for example (but not limited to): a copper-added foam gasket, a copper-added rubber gasket, a copper gasket, an electromagnetic interface (EMI) shielding gasket, etc.

The aforementioned examples are not intended to limit the scope of the invention.

In one or more embodiments, the first gasket (315) and the second gasket protect at least the portion of the system (e.g., 100, FIG. 1) from external EM radiation (e.g., radio frequency (RF) radiation, infrared (IR) radiation, etc.), in which the external EM radiation may be originated from unauthorized access activities of an opponent. The gaskets also prevent unintentional emissions (originated from, for example, the IHSs (e.g., 230A, 230B, FIG. 2.1)) from at least a portion of the system (e.g., 100, FIG. 1). In one or more embodiments, the gaskets also prevent emissions of noise or vibrations (e.g., noise abatement) (transpired within the system (e.g., 100, FIG. 1)) from at least the portion of the system (e.g., 100, FIG. 1).

In one or more embodiments, while the mechanical connection components discussed in FIGS. 3.1-3.3 are to implement the TEMPEST seal to the scaffolds (325, 326), remaining scaffolds in the system (e.g., 100, FIG. 1) may also include the same mechanical connection components to implement the TEMPEST seal. In one or more embodiments, the remaining scaffolds may be, for example (but not limited to): scaffold (e.g., 256D, FIG. 2.1), scaffold (e.g., 257D, FIG. 2.1), a ceiling scaffold, a floor scaffold, etc.

Turning now to FIG. 3.2, FIG. 3.2 shows an intermediate stage of the pairing process in accordance with one or more embodiments of the invention. In an embodiment of the invention shown in FIG. 3.2, after the connection interfaces are met, an enclosure component (330A) is affixed to the outside surface of the first scaffold (325) and to the outside surface of the second scaffold (326). Said another way, the enclosure component (330A) is affixed to the outside of the MECC (e.g., 210, FIG. 2.1) and to the outside of the MITC (e.g., 220, FIG. 2.1) (shown with a brace).

In one or more embodiments, the enclosure component (330A) includes a first set of holes (not shown) and a second set of holes (not shown). When the studs (e.g., 320A-320C, FIG. 3.1) pass through the first set of holes, a first set of nuts (322A-322C) is used to affix the enclosure component (330A) to the outside surface of the first scaffold (325). Similarly, when the studs (e.g., 320D-320F, FIG. 3.1) pass through the second set of holes, a second set of nuts (322D-322F) is used to affix the enclosure component (330A) to the outside surface of the second scaffold (326). In one or more embodiments, the first set of holes and the second set of holes may be slotted (e.g., oversized) holes to tolerate any size mismatch scenarios while affixing the enclosure component (330A).

Those skilled in the art will appreciate that while the nuts (322A-322F) are used to affix the enclosure component (330A), any other mechanical or non-mechanical components may be used to affix the enclosure component (330A) without departing from the scope of the invention.

In one or more embodiments, when the connection interface of the first scaffold (325) is connected to the connection interface of the second scaffold (326), a scaffold interface (e.g., a seam) (323) is generated. More specifically, when the first scaffold (325) is pushed toward to the second scaffold (326), the first gasket (315) and the second gasket are crushed, and the scaffold interface (323) is generated.

In one or more embodiments, an area of the enclosure component (330A) is less than an area of the outside surface of the first scaffold (325) and an area of the outside surface of the second scaffold (326). Further, once affixed, the enclosure component (330A) overlaps at least a portion of the scaffold interface (323).

In one or more embodiments, the enclosure component (330A) may be, for example (but not limited to): a steel plate, a copper-added galvanized iron plate, a copper plate, etc. The enclosure component (330A) provides an extra layer of structural support to the first scaffold (325) and to the second scaffold (326) to keep the scaffolds (325, 326) together.

In one or more embodiments, the enclosure component (330A) (e.g., the steel plate) may be painted (i) for aesthetic reasons and/or (ii) to prevent corrosion over time. For example, a customer may want to paint the enclosure component (330A) for security purposes. In this manner, even if the system (e.g., 100, FIG. 1) is a SCIF, the system (e.g., 100, FIG. 1) can be made to look like a non-SCIF to minimize potential unauthorized access activities.

The aforementioned examples are not intended to limit the scope of the invention.

In one or more embodiments, the enclosure component (330A) (e.g., the copper-added galvanized iron plate) may protect at least the portion of the system (e.g., 100, FIG. 1) from the external EM radiation. The enclosure component (330A) may also prevent unintentional emissions (e.g., RF emissions, IR emissions, etc.) from at least the portion of the system (e.g., 100, FIG. 1).

Turning now to FIG. 3.3, FIG. 3.3 shows a final stage of the pairing process in accordance with one or more embodiments of the invention. In an embodiment of the invention shown in FIG. 3.3, an electromagnetic interface (EMI) shielding component (335) is affixed to an inside surface of the first scaffold (325) and to an inside surface of the second scaffold (326). Said another way, the EMI shielding component (335) is affixed to the inside of the MECC (e.g., 210, FIG. 2.1) and to the inside of MITC (e.g., 220, FIG. 2.1) (shown with a brace).

In one or more embodiments, once affixed to the first scaffold (325) and to the second scaffold (326), the EMI shielding component (335) overlaps at least a portion of the first scaffold (325) and the second scaffold (326). The EMI shielding component (335) also overlaps at least a second portion of the scaffold interface (323). Further, a size of the EMI shielding component (335) may be customized based on the TEMPEST requirements. For example, to comply with the TEMPEST requirements, the EMI shielding component (335) may be extended along an entire inside surface of the first scaffold (325) and an entire inside surface of the second scaffold (326).

In one or more embodiments, the EMI shielding component (335) may be, for example (but not limited to): a copper sheet metal, a copper-added galvanized iron sheet metal, an EMI tape, etc. Similar to the first gasket (e.g., 315, FIG. 3.1) and to the second gasket, the EMI shielding component (335) protects at least the portion of the system (e.g., 100, FIG. 1) from the external EM radiation. The EMI shielding component (335) also prevents the unintentional emissions from at least the portion of the system (e.g., 100, FIG. 1).

In one or more embodiments, the EMI shielding component (335) includes a first set of holes (not shown) and a second set of holes (not shown). The first set of holes allows a first set of studs (not shown) located on the inside surface of the first scaffold (325) to pass through, and interface with a second enclosure component (330B) and a third set of nuts (322G-322I). Similarly, the second set of holes allows a second set of studs (not shown) located on the inside surface of the second scaffold (326) to pass through, and interface with the second enclosure component (330B) and a fourth set of nuts (322J-322L). In one or more embodiments, the first set of holes and the second set of holes may be slotted holes to tolerate any size mismatch scenarios while affixing the EMI shielding component (335).

In one or more embodiments, similar to the enclosure component (330A), the second enclosure component (330B) includes a first set of holes (not shown) and a second set of holes (not shown). After affixing the EMI shielding component (335), the second enclosure component (330B) is affixed to the EMI shielding component (335). More specifically, when the first set of studs located on the inside surface of the first scaffold (325) passes through the first set of holes of the EMI shielding component (335) and the first set of holes of the second enclosure component (330B), the third set of nuts (322G-322I) is used to affix the second enclosure component (330B) to the EMI shielding component (335).

Further, when the second set of studs located on the inside surface of the second scaffold (326) passes through the second set of holes of the EMI shielding component (335) and the second set of holes of the second enclosure component (330B), the fourth set of nuts (322J-322L) is used to affix the second enclosure component (330B) to the EMI shielding component (335). In this manner, the second enclosure component (330B) secures the EMI shielding component (335) to the first scaffold (325) and to the second scaffold (326).

Those skilled in the art will appreciate that while the nuts (322G-322L) are used to affix the second enclosure component (330B), any other mechanical or non-mechanical components may be used to affix the second enclosure component (330B) without departing from the scope of the invention.

In one or more embodiments, an area of the second enclosure component (330B) is equal to an area of the enclosure component (330A). While providing structural support to the EMI shielding component (335), the second enclosure component (330B) also provides structural support to the first scaffold (325) and to the second scaffold (326) to keep the scaffolds (325, 326) together. Similar to the enclosure component (330A), the second enclosure component (330B) may also be painted (i) for aesthetic reasons and/or (ii) to prevent corrosion over time. The second enclosure component (330B) may protect at least the portion of the system (e.g., 100, FIG. 1) from the external EM radiation. The second enclosure component (330B) may also prevent the unintentional emissions from at least the portion of the system (e.g., 100, FIG. 1).

To comply with the TEMPEST requirements, as discussed above, the electrical connection components and the airflow connection components need to be TEMPEST certified (e.g., TEMPEST suitable) as well.

In general, there are two types of emissions: (i) conducted emission and (ii) radiated emission. Radiated emissions are formed when the components of the system (e.g., 100, FIG. 1) act as antennas to transmit EM radiation. When EM radiation is conducted along the components (particularly, along the electrical connection components), the EM radiation is referred to as "conducted". A component that generates conducted radiation may be, for example (but not limited to): an internal grounding component (GC), an external GC, a data cable, an electrical ground cable, an electrical ground bar, a ground lug, a printed circuit board, a switching transistor, a high-power amplifier, a power supply component, etc.

The aforementioned example is not intended to limit the scope of the invention.

As used herein, a "cable" includes any cable, conduit, or line that carries one or more conductors and that is flexible over at least a portion of its length. A cable may include a connector portion, such as a plug, at one or more of its ends.

For example, a cable may act as an antenna to transmit signals directly, or even both receive the signals and re-emit the signals further away from a source component. The cable may act as the antenna in such a manner that the cable could transmit signals much more efficiently than the source component itself. As yet another example, if grounding components (e.g., an internal GC, an electrical ground bar, etc.) of a grounding system are not installed correctly such that there is a path in the grounding system with a high resistance, then the grounding system may act as an antenna.

Based on the aforementioned reasons and to be to comply with the TEMPEST requirements, the electrical connection components need to be dedicated to and contained within the system (e.g., 100, FIG. 1), and any power supply feed entering into the system (e.g., 100, FIG. 1) needs to be terminated.

Further, for the airflow connection components, all of the ECCs and the ducting need to be equipped with barred barriers to prevent intrusion, with inspection points installed within the system (e.g., 100, FIG. 1). For example, if there are openings in the ducting that exceed a certain limit (e.g., 96 square inches), then the openings need to be outfitted with steel bars that are a half inch thick and extend six inches away from the center in each direction. The bars need to be welded together where they intersect. In addition, the ducting need to have special components (e.g., non-conductive breaks, Z ducts, sound baffles, etc.) to ensure that EM emanations do not leave the system (e.g., 100, FIG. 1).

FIGS. 4.1-4.3 show top views of a portion of the system of FIG. 2.2 in accordance with one or more embodiments of the invention.

Turning now to FIG. 4.1, FIG. 4.1 shows a top view of the portion of the system of FIG. 2.2 in accordance with one or more embodiments of the invention. In an embodiment of the invention shown in FIG. 4.1, the embodiment includes an MITC (400) and a MECC (410). The MITC (400) may be the same as the MITC (260A) as discussed above in reference to FIG. 2.2. Similarly, the MECC (410) may be the same as the MECC (264A) as discussed above in reference to FIG. 2.2.

In one or more embodiments, the MITC (400) includes one or more scaffolds (e.g., 452) and the MECC (410) includes one or more scaffolds (e.g., 450, 451, etc.). The scaffold (452) may be the same as the scaffold (267A) as discussed above in reference to FIG. 2.2. In one or more embodiments, an interposer (not shown) of the MECC (410) may include a first set of mechanical connection components (not shown). Similarly, a connection interface (not shown) of the MITC (400) may include a second set of mechanical connection components (not shown). Details of the mechanical connection components are described above in reference to FIG. 3.1.

In one or more embodiments, after the interposer is connected to the connection interface, enclosure components (415A, 415B) are affixed to the outside of the MECC (410) and to the outside of the MITC (400). More specifically, for example, the enclosure component (415A) is affixed to an outside surface of the scaffold (450) and to an outside surface of the scaffold (452). Similar to the enclosure component (e.g., 330A, FIG. 3.2), the enclosure component (415A) includes a first set of holes (not shown) and a second set of holes (not shown). When the first set of mechanical connection components passes through the first set of holes, a first set of nuts (not shown) is used to affix the enclosure component (415A) to the outside surface of the MECC (410). Similarly, when the second set of mechanical connection components passes through the second set of holes, a second set of nuts (not shown) is used to affix the enclosure component (415A) to the outside surface of the MITC (400). Details of the holes and the enclosure components are described above in reference to FIG. 3.1.

In one or more embodiments, when the interposer is connected to the connection interface, a scaffold interface (405) is generated. Further, referring to FIG. 3.2, when the enclosure component (330A) is affixed to the outside surface of the first scaffold (325) and to the outside surface of the second scaffold (326), no gap is generated. However, when the enclosure component (415A) is affixed to the outside surfaces of the scaffolds (450, 452), a gap is generated among the outside surfaces of the scaffolds (450, 452) and an inside surface of the enclosure component (415A). In one or more embodiments, the gap overlaps at least a portion of the scaffold interface (405).

In one or more embodiments, an EMI shielding component (425A) is disposed within the gap, in which the EMI shielding component (425A) overlaps at least the portion of the scaffold interface (405). In one or more embodiments, the EMI shielding component (425A) protects at least a portion of the system of FIG. 2.2 from the external EM radiation. The EMI shielding component (425A) also prevents the unintentional emissions from at least the portion of the system of FIG. 2.2.

In one or more embodiments, the EMI shielding component (425A) may be, for example, a copper mesh. In order to fill out the gap, the EMI shielding component (425A) may be squeezed. Further, in order to affix the EMI shielding component (425A) to the outside surfaces of the scaffolds (450, 452) and to the inside surface of the enclosure component (415A), mechanical or non-mechanical components may be used.

The aforementioned example is not intended to limit the scope of the invention.

In one or more embodiments, the enclosure component (415A) may protect at least the portion of the system of FIG. 2.2 from the external EM radiation. The enclosure component (415A) may also prevent the unintentional emissions from at least the portion of the system of FIG. 2.2.

Similar to the enclosure component (415A), the enclosure component (415B) includes a third set of holes (not shown) and a fourth set of holes (not shown). When the first set of mechanical connection components passes through the third set of holes, a third set of nuts (not shown) is used to affix the enclosure component (415B) to the outside surface of the MECC (410). Similarly, when the second set of mechanical connection components passes through the fourth set of holes, a fourth set of nuts (not shown) is used to affix the enclosure component (415B) to the outside surface of the MITC (400).

In one or more embodiments, when the interposer is connected to the connection interface, a second scaffold interface (406) is generated. Further, when the enclosure component (415B) is affixed to outside surfaces of the scaffolds (451, 452), a second gap is generated among the outside surfaces of the scaffolds (451, 452) and an inside surface of the enclosure component (415B). In one or more embodiments, the second gap overlaps at least a portion of the second scaffold interface (406).

In one or more embodiments, an EMI shielding component (425B) is disposed within the second gap, in which the EMI shielding component (425B) overlaps at least the portion of the second scaffold interface (406). In one or more embodiments, the EMI shielding component (425B) protects at least a second portion of the system of FIG. 2.2 from the external EM radiation. The EMI shielding component (425B) also prevents the unintentional emissions from at least the second portion of the system of FIG. 2.2.

In one or more embodiments, similar to the enclosure component (415A), the enclosure component (415B) may protect at least the second portion of the system of FIG. 2.2 from the external EM radiation. The enclosure component (415B) may also prevent the unintentional emissions from at least the second portion of the system of FIG. 2.2.

In one or more embodiments, while the mechanical connection components discussed in FIGS. 4.1-4.3 are to implement the TEMPEST seal to the scaffolds (450-452), remaining scaffolds (e.g., a ceiling scaffold, a floor scaffold, etc.) of the MITC (400) and the MECC (410) may also include the same mechanical connection components to implement the TEMPEST seal.

Turning now to FIG. 4.2, FIG. 4.2 shows a top view of the portion of the system of FIG. 2.2 in accordance with one or more embodiments of the invention. In an embodiment of the invention shown in FIG. 4.2, the embodiment includes the MITC (400) and the MECC (410).

In comparison to the FIG. 4.1 and as another option, after the interposer is connected to the connection interface, EMI shielding components (430A, 430B) (e.g., copper sheet metals) are affixed to the outside of the MECC (410) and to the outside of the MITC (400). More specifically, for example, the EMI shielding component (430A) is affixed to the outside surface of the scaffold (450) and to the outside surface of the scaffold (452). Similar to the EMI shielding component (e.g., 335, FIG. 3.3), the EMI shielding component (430A) includes a first set of holes (not shown) and a second set of holes (not shown). The first set of holes allows the first set of mechanical connection components to pass through, and interface with the enclosure component (415A) and the first set of nuts. Similarly, the second set of holes allows the second set of mechanical connection components to pass through, and interface with the enclosure component (415A) and the second set of nuts.

After affixing the EMI shielding component (430A), the enclosure component (415A) is affixed to the EMI shielding component (430A). More specifically, when the first set of mechanical connection components passes through the first set of holes of the EMI shielding component (430A) and the first set of holes of the enclosure component (415A), the first set of nuts is used to affix the enclosure component (415A) to the EMI shielding component (430A).

Further, when the second set of mechanical connection components passes through the second set of holes of the EMI shielding component (430A) and the second set of holes of the enclosure component (415A), the second set of nuts is used to affix the enclosure component (415A) to the EMI shielding component (430A). In this manner, the enclosure component (415A) secures the EMI shielding component (430A) to the scaffolds (450, 452).

Those skilled in the art will appreciate that while the EMI shielding component (430A) is shown as having a particular shape, the EMI shielding component (430A) may be in another shape (while still complying with the TEMPEST requirements) without departing from the scope of the invention.

In one or more embodiments, an area of the enclosure component (415A) is greater than or equal to an area of the EMI shielding component (430A). In this manner, for example, the enclosure component (415A) may encapsulate the EMI shielding component (430A) and protect the EMI shielding component (430A) from environmental effects (e.g., corrosion).

The aforementioned example is not intended to limit the scope of the invention.

In one or more embodiments, based on a customer requirement, a gap that is generated among the outside surfaces of the scaffolds (450, 452) and an inside surface of the EMI shielding component (430A) may be filled out with another EMI shielding component (e.g., a copper mesh). In this manner, a level of protection against the external EM radiation and the unintentional emissions may be improved.

In one or more embodiments, similar to the EMI shielding component (430A), the EMI shielding component (430B) includes a third set of holes (not shown) and a fourth set of holes (not shown). The third set of holes allows the first set of mechanical connection components to pass through, and interface with the enclosure component (415B) and the third set of nuts. Similarly, the fourth set of holes allows the second set of mechanical connection components to pass through, and interface with the enclosure component (415B) and the fourth set of nuts.

After affixing the EMI shielding component (430B), the enclosure component (415B) is affixed to the EMI shielding component (430B). More specifically, when the first set of mechanical connection components passes through the third set of holes of the EMI shielding component (430B) and the third set of holes of the enclosure component (415B), the third set of nuts is used to affix the enclosure component (415B) to the EMI shielding component (430B).

Further, when the second set of mechanical connection components passes through the fourth set of holes of the EMI shielding component (430B) and the fourth set of holes of the enclosure component (415B), the fourth set of nuts is used to affix the enclosure component (415B) to the EMI shielding component (430B). In this manner, the enclosure component (415B) secures the EMI shielding component (430B) to the scaffolds (451, 452).

Those skilled in the art will appreciate that while the EMI shielding component (430B) is shown as having a particular shape, the EMI shielding component (430B) may be in another shape (while still complying with the TEMPEST requirements) without departing from the scope of the invention.

In one or more embodiments, an area of the enclosure component (415B) is greater than or equal to an area of the EMI shielding component (430B). In this manner, for example, the enclosure component (415B) may encapsulate the EMI shielding component (430B) and protect the EMI shielding component (430B) from the environmental effects.

The aforementioned example is not intended to limit the scope of the invention.

In one or more embodiments, based on a customer requirement, a gap that is generated among the outside surfaces of the scaffolds (451, 452) and an inside surface of the EMI shielding component (430B) may be filled out with another EMI shielding component (430B). In this manner, the level of protection against the external EM radiation and the unintentional emissions may be further improved.

Turning now to FIG. 4.3, FIG. 4.3 shows a top view of the portion of the system of FIG. 2.2 in accordance with one or more embodiments of the invention. In an embodiment of the invention shown in FIG. 4.3, the embodiment includes the MITC (400) and the MECC (410).

In comparison to the FIGS. 4.1-4.2 and as another option, after the interposer is connected to the connection interface, the enclosure component (415A) is affixed to the outside surfaces of the scaffolds (450, 452) and the EMI shielding component (425A) is disposed within the gap. Further, the EMI shielding component (430B) and the enclosure component (415B) are affixed to the outside surfaces of the scaffolds (451, 452). This provides a flexibility to the customer to satisfy the TEMPEST requirements in different ways.

In one or more embodiments, rather than being oriented in a same plane (e.g., perpendicularly (see FIG. 2.2), in parallel (see FIG. 2.1), etc.) as the MITC (400), the MECC (410) may be oriented in a vertically different plane (to improve the modularity of the system shown in FIG. 2.2). In this case, pairing methods discussed above (in FIGS. 3.1-3.3 and 4.1-4.3) may still be used to comply with the TEMPEST requirements. Further, after dissembling the components (e.g., the MITC (260A), the MECC (264A), etc.) of the system shown in FIG. 2.2, the components may be reassembled by following the above-mentioned pairing methods.

The problems discussed throughout this application should be understood as being examples of problems solved by embodiments described herein, and the various embodiments should not be limited to solving the same/similar problems. The disclosed embodiments are broadly applicable to address a range of problems beyond those discussed herein.

While embodiments discussed herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A modular data center, comprising:
   a modular information technology component (MITC), wherein the MITC comprises a first scaffold;
   a modular utility control component (MUCC), wherein the MUCC comprises a second scaffold; and
   a modular environmental control component (MECC), wherein the MECC comprises a third scaffold,
   wherein the MITC and the MUCC are oriented in a first direction and the MECC is oriented in a second direction, wherein the first direction and the second direction are perpendicular to each other,
   wherein the first scaffold is connected perpendicularly to the third scaffold to form a scaffold interface, wherein the first scaffold is connected in parallel to the second scaffold to form a second scaffold interface,
   wherein an enclosure component is affixed to an outside surface of the first scaffold and to an outside surface of the third scaffold,
   wherein, once the enclosure component is affixed to the first scaffold and to the third scaffold, a gap is generated among the outside surface of the first scaffold, the outside surface of the third scaffold, an inside surface of the enclosure component, wherein the gap overlaps at least a portion of the scaffold interface, wherein a second enclosure component is affixed to the outside surface of the first scaffold and to an outside surface of the second scaffold, and wherein, once the second enclosure component is affixed to the first scaffold and to the second scaffold, the second enclosure component overlaps at least a portion of the second scaffold interface.

2. The modular data center of claim 1, wherein an electromagnetic interface (EMI) shielding component is disposed within the gap, wherein the EMI shielding component protects at least a portion of the modular data center from external electromagnetic (EM) radiation, and wherein the EMI shielding component overlaps at least the portion of the scaffold interface.

\* \* \* \* \*